(12) United States Patent
Sekimoto

(10) Patent No.: US 8,653,997 B2
(45) Date of Patent: Feb. 18, 2014

(54) MODULATOR

(71) Applicant: Fujitsu Semiconductor Limited, Yokohama (JP)

(72) Inventor: Uichi Sekimoto, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/724,299

(22) Filed: Dec. 21, 2012

(65) Prior Publication Data

US 2013/0194125 A1 Aug. 1, 2013

(30) Foreign Application Priority Data

Jan. 27, 2012 (JP) ................................ 2012-014847

(51) Int. Cl.
*H03M 3/00* (2006.01)

(52) U.S. Cl.
USPC .......................................... 341/143; 341/155

(58) Field of Classification Search
USPC .......................... 341/143, 155, 156, 172, 120
See application file for complete search history.

(56) References Cited

U.S. PATENT DOCUMENTS 4,542,354 A * 9/1985 Robinton et al. ............. 341/143
2008/0018509 A1   1/2008 Colmer

FOREIGN PATENT DOCUMENTS

JP 2009-540716 A 11/2009

* cited by examiner

*Primary Examiner* — Joseph Lauture
(74) *Attorney, Agent, or Firm* — Arent Fox LLP

(57) ABSTRACT

A modulator that quantizes a first signal into a quantized signal having a plurality of bits includes an integrator performing sampling on the first signal in a first period, and to integrate a difference between the first signal and a reference signal in a second period; and a quantizer receiving a second signal which is an output of the integrator and operating in synchronization with a first clock having a cycle shorter than the first period, the quantizer generating the quantized signal on the basis of the second signal in the first period and outputting the reference signal on the basis of the quantized signal to the integrator.

5 Claims, 14 Drawing Sheets

MODULATOR

CROSS-REFERENCE TO RELATED APPLICATIONS

This application is based upon and claims the benefit of priority of the prior Japanese Patent Application No. 2012-014847, filed on Jan. 27, 2012, the entire contents of which are incorporated herein by reference.

FIELD

The embodiment discussed herein is related to a modulator.

BACKGROUND

A modulator such as a ΔΣ modulator is used in an audio device and an A/D converter. For example, the ΔΣ modulator quantizes an analog input signal into a one-bit quantized signal. Otherwise, the ΔΣ modulator may quantize an analog input signal into a quantized signal having a plurality of bits. A general ΔΣ modulator includes an adder (adder/subtractor), an integrator, a comparator, and a D/A converter (see, for example, Japanese Laid-open Patent Publication No. 2009-540716).

The adder subtracts a feedback signal from the analog input signal. The integrator integrates the output of the adder. Then, the comparator compares the output of the integrator with a reference value. Based on the comparison result, a quantized signal is generated. Further, the D/A converter performs D/A conversion on the output of the comparator (quantized signal) to generates a feedback signal.

A signal-to-noise ratio (hereinafter may be simplified as an "SNR"), may be improved by, for example, increasing a sampling frequency. Otherwise, the SNR may also be improved by increasing the number of bits of the output signal of the modulator. Further, in the general ΔΣ modulator generating a quantized signal having a plurality of bits, the comparator includes an A/D converter generating (outputting) a plurality of bits.

Reference may be made to Japanese Laid-open Patent Publication No. 2009-540716.

SUMMARY

According to an aspect, a modulator that quantizes a first signal into a quantized signal having a plurality of bits includes an integrator performing sampling on the first signal in a first period, and to integrate a difference between the first signal and a reference signal in a second period; and a quantizer receiving a second signal which is an output of the integrator and operating in synchronization with a first clock having a cycle shorter than the first period, the quantizer generating the quantized signal on the basis of the second signal in the first period and outputting the reference signal on the basis of the quantized signal to the integrator.

The objects and advantages of the embodiments disclosed herein will be realized and attained by means of the elements and combinations particularly pointed out in the claims.

It is to be understood that both the foregoing general description and the following detailed description are exemplary and explanatory and are not restrictive of the invention as claimed.

DESCRIPTION OF EMBODIMENT

In a modulator, when the sampling frequency in increased to improve the SNR, the entire modulator operates faster. As a result, the current consumption may be increased. Further, in a normal method of generating a quantized signal having a plurality of bits, an A/D converter outputting a plurality of bits and a D/A converter inputting a plurality of bits may be used. In such a case, the scale of the circuit may be increased. Further, due to the increase of the circuit scale, the current consumption may be increased accordingly.

According to an embodiment, it may become possible to generate a quantized signal having a plurality of bits while controlling a circuit scale.

In the following, embodiments of the present invention are described with reference to the accompanying drawings. Herein, the signals supplied through the terminals VIN, CNT1, CNT2, CLK1 use the same signs (names) as those of the terminals. Further, the signal to be transmitted to the terminal DOUT uses the same sign (name) as that of the terminal.

Figure 1:
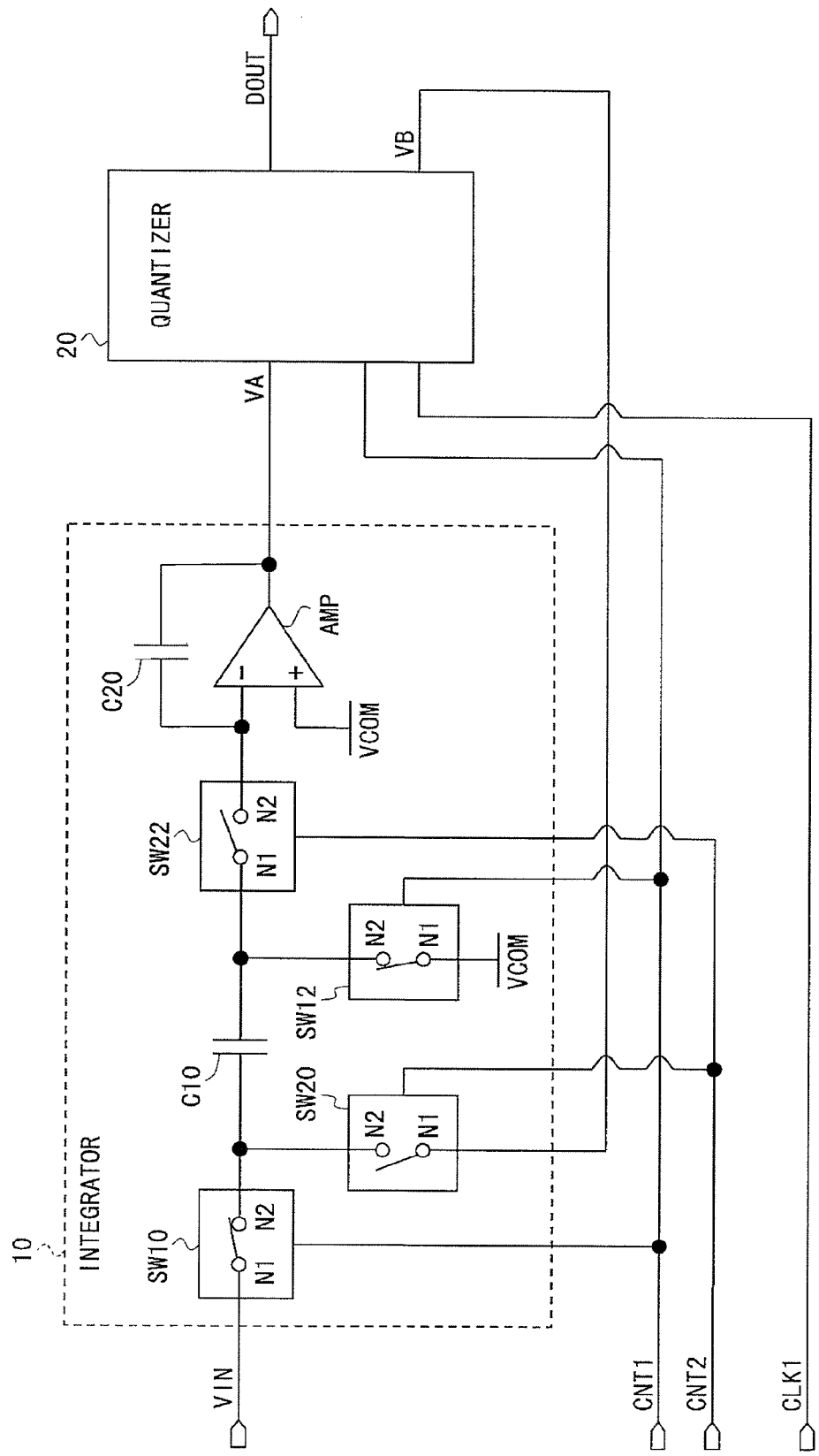
FIG. 1 illustrates an example configuration of a modulator according to an embodiment.

FIG. 1 illustrates an example configuration of a modulator according to one embodiment. The modulator performs, for example, a ΔΣ modulation to quantize an analog input signal VIN (hereinafter may also be called an input voltage VIN) to obtain a digital signal DOUT having a plurality of bits (hereinafter may also be called a "quantized signal DOUT").

For example, the modulator quantizes the analog input signal VIN to obtain the quantized signal DOUT having two bits. Here, the number of bits of the quantized signal DOUT is not limited to two bits. Further, for example, the modulator includes an integrator 10 and a quantizer 20.

As illustrated in FIG. 1, the integrator 10 includes switches SW10, SW12, SW20, and SW22, capacitors C10 and C20, and a differential amplifier AMP. One end of the capacitor C10 is connected to a node N2 of the switch SW10 and a node N2 of the switch SW20. The other end of the capacitor C10 is connected to a node N2 of the switch SW12 and a node N1 of the switch SW22.

The node N1 of the switch SW10 is connected to a terminal VIN, so as to input an input voltage VIN. The node N1 of the switch SW12 is connected to a voltage VCOM. The voltage VCOM is, for example, a ground voltage. Further, the node N1 of the switch SW20 is connected to the quantizer 20, so as to input a reference voltage VB output from the quantizer 20. The reference voltage VB corresponds to a value of the quantized signal DOUT.

Further, one end of the capacitor C20 is connected to an inverting input terminal (−) of the differential amplifier AMP. The other end of the capacitor C20 is connected to the output terminal of the differential amplifier AMP. Further, the output terminal of the differential amplifier AMP is connected to the quantizer 20.

The non-inverting input terminal (+) of the differential amplifier AMP is connected to the voltage VCOM. Accordingly, one of the capacitor C20 is virtually grounded. The capacitance of the capacitor C20 is, for example, similar to that of the capacitor C10.

The switches SW10 and SW12 are turned on and off based on a control signal CNT1. For example, the switches SW10 and SW12 are turned on when the control signal CNT1 is a high level, and are turned off when the control signal CNT1 is a low level. The switches SW20 and SW22 are turned on and off based on a control signal CNT2. For example, the switches SW20 and SW22 are turned on when the control signal CNT2 is a high level, and are turned off when the control signal CNT2 is a low level.

The control signal CNT2 is, for example an inversed control signal CNT1. Therefore, in this case, the switches SW10 and SW12 are turned on (i.e., a conducting state) when the switches SW20 and SW22 are turned off (i.e., a non-conducting state), and the switches SW10 and SW12 are turned off when the switches SW20 and SW22 are turned on.

In the following, a period while the switches SW10 and SW12 are turned on (i.e., the switches SW20 and SW22 are turned off) may also be called a "charging period", and the switches SW20 and SW22 are turned on (i.e., the switches SW10 and SW12 are turned off) may also be called an "integrating period".

The charging period and the integrating period are alternately repeated. For example, each of the cycles of the control signals CNT1 and CNT2 corresponds to a sum of the charging period and the integrating period.

In the charging period, the one end of the capacitor C10 is connected to the terminal VIN via the switch SW10, and the other end of the capacitor C10 is fixed to the voltage VCOM via the switch SW12. By doing this, the capacitor C10 is charged by the input voltage VIN while the switches SW10 and SW12 are turned on.

Namely, the integrator 10 performs sampling while the input voltage VIN is charged. Here, a charge Q10 charged in the capacitor C10 is expressed in the following formula (1) when the capacitance of the capacitor C10 is given as C10.

$$Q10 = C10 \cdot (VIN - VCOM) \tag{1}$$

In the integrating period, the one end of the capacitor C10 is connected to the reference voltage VB of the quantizer 20 via the switch SW20. The other end of the capacitor C10 is connected to the inverting input terminal (−) of the differential amplifier AMP via the switch SW22. The inverting input terminal (−) of the differential amplifier AMP is maintained at the voltage VCOM of the non-inverting input terminal (+) of the differential amplifier AMP.

Accordingly, the other end of the capacitor C20 is maintained at the voltage VCOM. Therefore, the charge amount of the capacitor C10 is adjusted in accordance with the differential voltage between the reference voltage VB and the voltage VCOM.

Further, the one end of the capacitor C20 is connected to the other end of the capacitor C10 via switch S22. Therefore, the charge amount of the capacitor C10 is adjusted by the movement of the charges between the capacitors C10 and C20.

The charges ΔQ moving between the capacitors C10 and C20 are expressed in the following formula (2). Further, the charges ΔQ are also expressed in the following formula (3) by substituting the formula (1) into the formula (2).

$$\Delta Q = C10 \cdot (VB - VCOM) - Q10 \tag{2}$$

$$\Delta Q = C10 \cdot (VB - VIN) \tag{3}$$

Namely, in the integrating period, the amount of the charges ΔQ corresponding to a differential voltage between the reference voltage VB and the input voltage VIN is moved between the capacitors C10 and C20. For example, when assuming that the voltage at the other end of the capacitor C20 (i.e., the voltage at the output terminal of the differential amplifier AMP) confirmed in the integrating period of the previous cycle is expressed as VAold, the reference VB corresponds to the quantized signal DOUT of the voltage VAold.

Further, the charges ΔQ are expressed by the following formula (4) by using the voltage VAold (the voltage at the other end of the capacitor C20 confirmed in the integrating period of the previous cycle) when the capacitance of the capacitor C20 is expressed as C20. Further, a voltage VA at the other end of the capacitor C20 is expressed in the following formula (5) based on the formulas (3) and (4).

$$\Delta Q = -C20 \cdot (VA - VAold) \tag{4}$$

$$VA = (C10/C20) \cdot (VIN - VB) + VAold \tag{5}$$

The formula (5) indicates that the voltage VA at the other end of the capacitor C20 corresponds to the voltage obtained by integrating the difference voltage between the input voltage VIN and the reference voltage VB. As described above, the integrator 10 integrates the difference voltage between the input voltage VIN and the reference voltage VB in the integrating period.

Further, the voltage VA is supplied to the quantizer 20. Namely, the integrator 10 outputs the voltage VA to the quantizer 20, the voltage VA being obtained by integrating the difference voltage between the input voltage VIN and the reference voltage VB in the integrating period.

For example, the quantizer 20 inputs (receives), the control signals CNT1, a clock CLK1 and the voltage VA, and outputs the quantized signal DOUT and the reference voltage VB. The cycle of the clock CLK1 is shorter than the charging period (e.g., the period while the control signal CNT1 is a high level).

For example, the number of clocks of the charging period of the clock CLK1 is equal to the number of bits of the quantized signal DOUT. Further, the quantized signal DOUT is, for example, a signal obtained by quantizing the voltage VA of the charging period (i.e., the voltage VA confirmed in the integrating period of the previous cycle). Therefore, the reference voltage VB corresponds to the quantized signal DOUT of the voltage VA of the charging period (e.g., the voltage VAold in formula (5)).

For example, the quantizer 20 operates in synchronization with the clock CLK1, and quantizes the voltage VA in the charging period. Further, the quantizer 20 outputs the quantized signal DOUT of the voltage VA in the integrating period.

Further, the quantizer 20 outputs the reference voltage VB based on the quantized signal DOUT to the node N1 of the switch SW20 of the integrator 10. As described above, the quantizer 20 generates the quantized signal DOUT based on the voltage VA, and outputs the reference voltage VB based on the quantized signal DOUT to the integrator 10.

Figure 2:
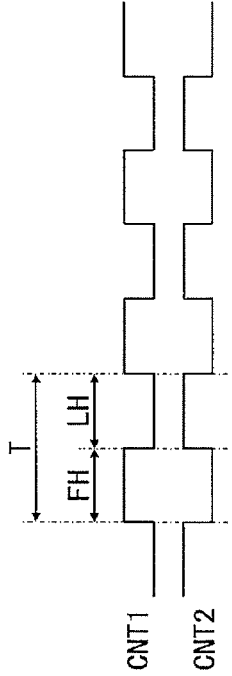
FIG. 2 illustrates an example operation of the modulator of FIG. 1.

FIG. 2 illustrates an example operation of the modulator of FIG. 1. Specifically, FIG. 2 indicates the states of the voltages VIN, VA, and VB and the quantized signal DOUT in binary digits. The remarks of FIG. 2 indicate the timings of the control signals CNT1 and CNT2 and conditions in quantizing.

The period "FH" in the first half of the cycle T of the control signals CNT1 and CNT2 denotes the charging period, and the period "LH" in the last half of the cycle T denotes the integrating period.

In the example of FIG. 2, the range of input voltage VA is equal to or greater than 0 V and equal to or less than 4 V, and the quantized signal DOUT has four levels of "00", "01", "10", and "11". Further, the levels of "00", "01", "10", and "11" of the quantized signal DOUT correspond to "1 V", "2 V", "3 V", and "4 V" of the reference voltage VB.

For example, when the voltage VA is equal to or greater than 0 V and equal to or less than 1 V (0≤VA≤1), the quantized signal DOUT is set to "00". When the quantized signal DOUT is "00", the reference voltage VB is set to 1 V. When the voltage VA is greater than 1 V and equal to or less than 2 V (1<VA≤2), the quantized signal DOUT is set to "01". When the quantized signal DOUT is "01", the reference voltage VB is set to 2 V.

When the voltage VA is greater than 2 V and equal to or less than 3 V (2<VA≤3), the quantized signal DOUT is set to "10". When the quantized signal DOUT is "10", the reference voltage VB is set to 3 V.

When the voltage VA is greater than 3 V and equal to or less than 4 V (3<VA≤4), the quantized signal DOUT is set to "11". When the quantized signal DOUT is "11", the reference voltage VB is set to 4 V.

In the operation of FIG. 2, the input voltage VIN in the cycles is 1.7 V. Further, the capacitance of the capacitor C10 is the same as that of the capacitor C20. Further, in FIG. 2, the row prior to the row of the first cycle indicates the voltages VA and VB and the quantized signal DOUT in the initial conditions.

The voltages VA and VB in the initial conditions are 0 V and 1 V, respectively. Therefore, in the first cycle (cycle=1), the voltage VA confirmed in the integrating period LH is 0.7 V (=1.7−1+0) based on formula (5). Therefore, the quantized signal DOUT is set to "00", and the reference voltage VB is set to 1 V.

In the second cycle, since the voltages VA and VB are 0.7 V and 1 V, respectively, in the previous cycle (i.e., the first cycle), the voltage VA confirmed in the integrating period LH is 1.4 V (=1.7−1+0.7) based on formula (5). Therefore, the quantized signal DOUT is set to "01", and the reference voltage VB is set to 2 V.

In the third cycle, since the voltages VA VB are 1.4 V and 2 V, respectively, in the previous cycle (i.e., the second cycle), the voltage VA confirmed in the integrating period LH is 1.1 V (=1.7−2+1.4) based on formula (5).

Therefore, the quantized signal DOUT is set to "01", and the reference voltage VB is set to 2V. As described above, in the cycles, the differential voltage between the input voltage VIN and the reference voltage VB is added to the voltage VA in the previous cycle (=VAold).

In the ΔΣ modulation, for example, by averaging the reference voltage VB corresponding to the quantized signal DOUT within a predetermined time period, the input voltage VIN may be demodulated.

In the example of FIG. 2, the numbers of "00" and "01" of the quantized signal DOUT are 4 and 6, respectively, in the ten cycles. Therefore, the an average value OUTave of the reference voltage VB corresponding to the quantized signal DOUT is expressed by the following formula (calculation) (6).

$$OUTave=(1\times 4+2\times 6)/10=1.6 \tag{6}$$

As described above, in this embodiment, the input signal VIN (e.g., 1.7 V) may be expressed in two-bit quantized signal DOUT.

Figure 3:
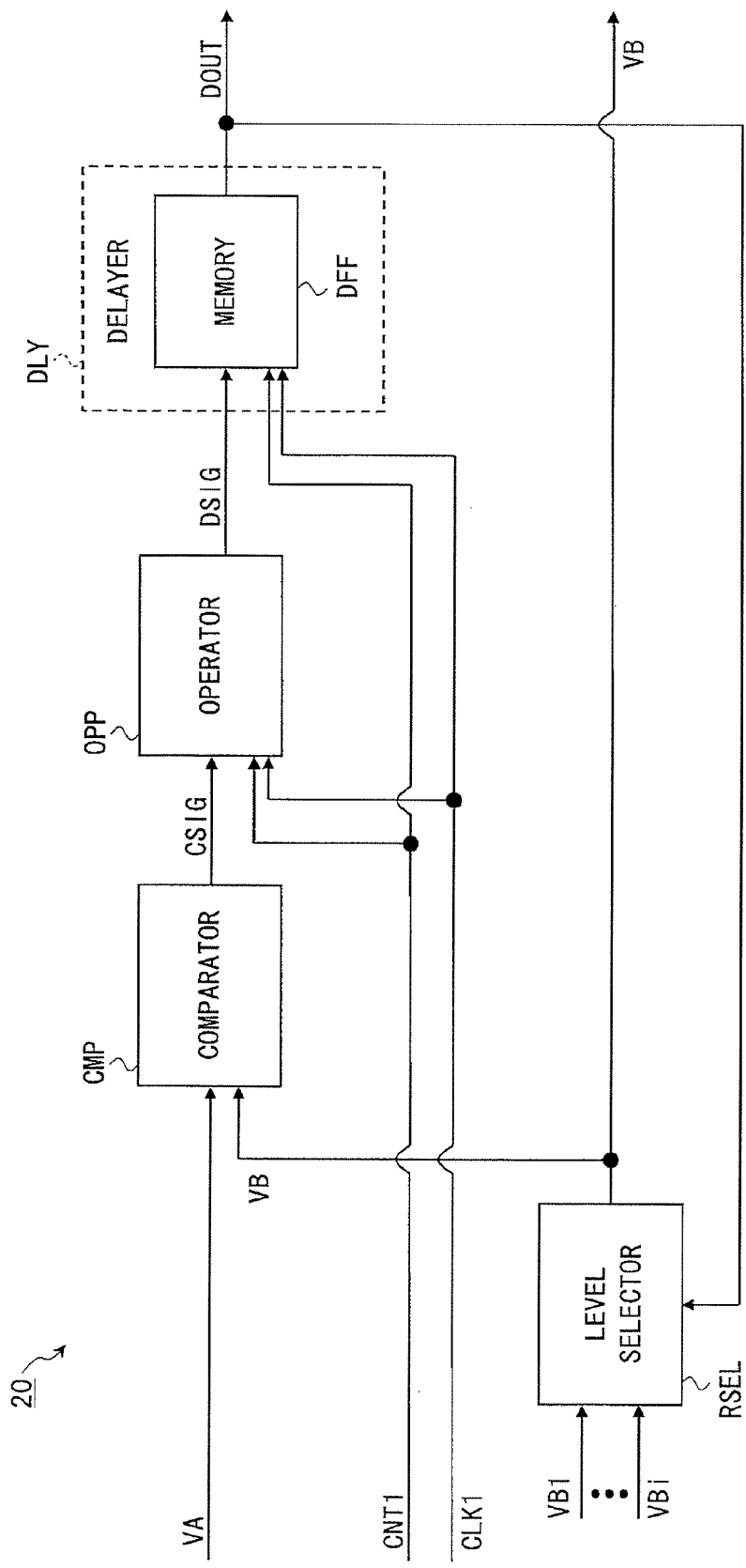
FIG. 3 illustrates an example configuration of a quantizer of FIG. 1.

FIG. 3 illustrates an example configuration of the quantizer 20 of FIG. 1. In FIG. 3, the signs "VB1" ... "VBi" denote reference voltages corresponding to values of the quantized signal DOUT. For example, the reference voltages "VB1" ... "VBi" are generated by voltage generators in the quantizer 20. Alternatively, the quantizer 20 may externally receive the reference voltages "VB1" ... "VBi".

The quantizer 20 receives, for example, the control signal CNT1, the clock CLK1 and the voltage VA, and generates the quantized signal DOUT and the reference voltage VB based on the reference voltage VB. For example, the quantizer 20 includes a level selector RSEL, a comparator CMP, an operator OPP, and a delayer DLY.

The level selector RSEL receives the quantized signal DOUT and plural reference voltages VBs ("VB1" ... "VBi"), and selects one reference voltage VB from the plural reference voltages VBs ("VB1" ... "VBi") based on the quantized signal DOUT. Then, the level selector RSEL outputs the selected reference voltage VB to the integrator 10 (e.g., the switch SW20 of the integrator 10 of FIG. 1) and the comparator CMP.

Namely, the level selector RSEL outputs the reference voltage VB to the integrator 10 and the comparator CMP, the reference voltage VB corresponding to the quantized signal DOUT received from the delayer DLY.

The comparator CMP receives the voltage VA and the reference voltage VB from the integrator 10 and the level selector RSEL, respectively, and compares the voltage VA with the reference voltage VB in the charging period FH (i.e., the period FH illustrated in FIG. 2).

Namely, the comparator CMP compares the output voltage VA output from the integrator 10 with the reference voltage VB selected by the level selector RSEL. Then, the comparator CMP outputs a comparison signal CSIG indicating the comparison result between the voltage VA and the reference voltage VB to the operator OPP.

The operator OPP receives, for example, the control signal CNT1, the clock CLK1, and the comparison signal CSIG, and outputs a quantized signal DSIG. For example, the operator OPP receives the comparison signal CSIG from the comparator CMP, generates the quantized signal DSIG based on the comparison signal CSIG having received in the charging period FH. Then, the operator OPP outputs the quantized signal DSIG to the delayer DLY.

The delayer DLY includes, for example, a memory DFF operating in synchronization with the clock CLK1. The memory DFF is, for example, a D flip-flop operating in synchronization with the clock CLK1.

For example, the memory DFF receives the control signal CNT1, the clock CLK1, and the quantized signal DSIG, and outputs the quantized signal DSIG in synchronization with the clock CLK1, the quantized signal DSIG having been received from the operator OPP. By doing this, the quantized signal DOUT is generated by delaying the quantized signal DSIG by substantially one cycle period of the clock CLK1.

For example, the memory DFF outputs the quantized signal DOUT generated by delaying the quantized signal DSIG to the outside of the quantizer 20 and the level selector RSEL. As described above, the delayer DLY operates in synchronization with the clock CLK1, delays the quantized signal DSIG received from the operator OPP, and outputs the delayed quantized signal DOUT to the level selector RSEL.

Further, the configuration of the quantizer 20 is not limited to the example configuration described above. For example, the quantizer 20 may output the output signal (quantized signal) DSIG output from the operator OPP instead of outputting the output signal (quantized signal) DOUT output from the delayer DLY to the outside of the quantizer 20.

In this case as well, the level selector RSEL receives the quantized signal DOUT generated by delaying the quantized signal DSIG from the delayer DLY. When the quantized signal of the voltage VA is output from the operator OPP, it may become possible to reduce the delay time from the input of the voltage VIN to the modulator until the modulation result is output from the modulator.

Figure 4:
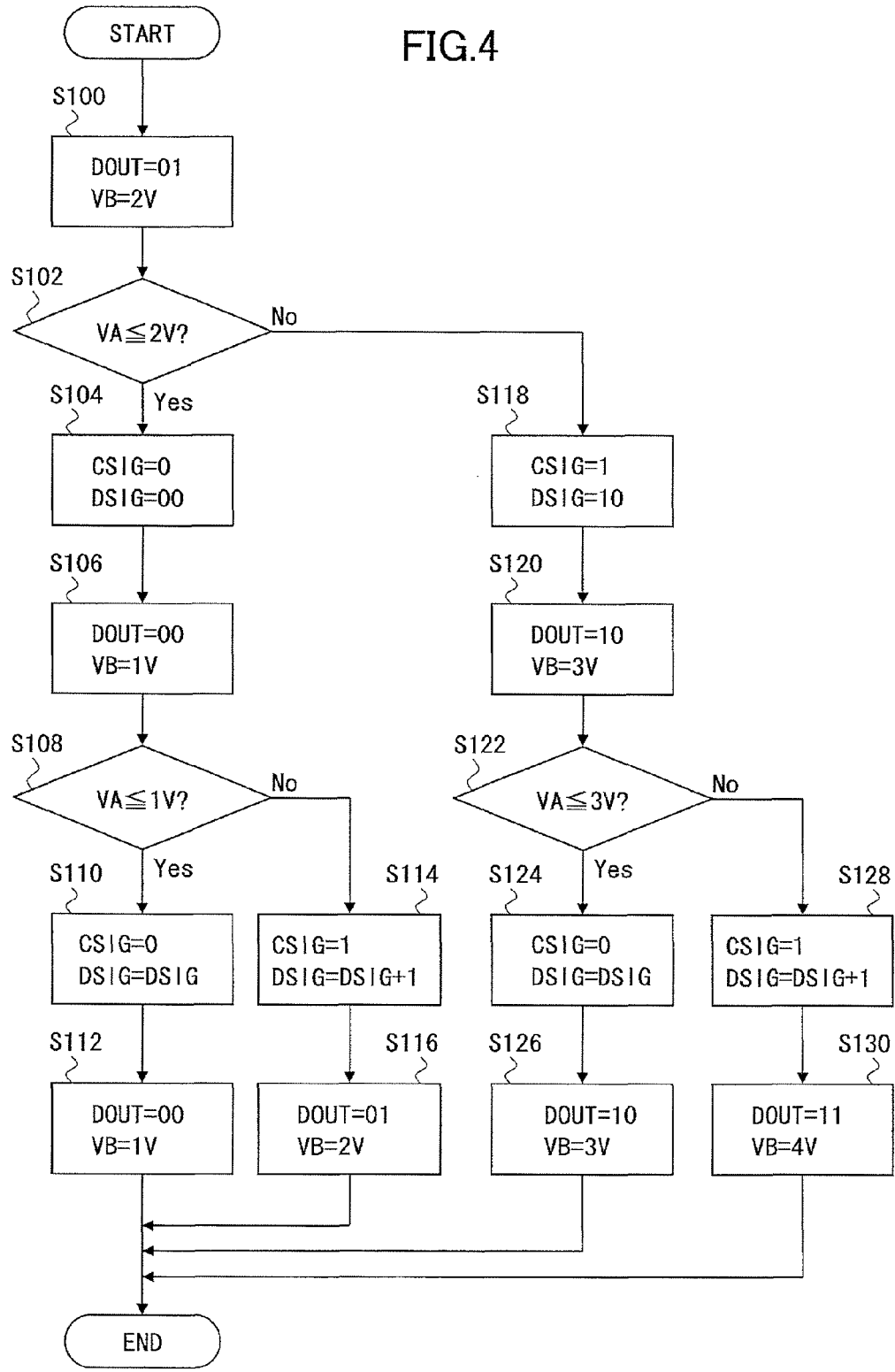
FIG. 4 illustrates an example operation of the quantizer of FIG. 3.

FIG. 4 illustrates an example operation of the quantizer 20 of FIG. 3. Specifically, FIG. 4 illustrates an example quantization operation of the quantizer 20 under the conditions illustrated in the remarks of FIG. 2. The operations of FIG. 4 may be realized by hardware alone, or by controlling hardware using software. In FIG. 4, the signals CSIG, DSIG, and DOUT are expressed in a binary digit form.

In the operation of FIG. 4, for example, the modulator quantizes the input voltage VIN having a range from 0 V to 4 V (i.e., 0≤VIN≤4) into the quantized signal DOUT having two bits. Further, the values "00", "01", "10", and "11" of the quantized signal DOUT corresponds to the values "1 V", "2 V", "3 V", and "4 V" of the reference voltage VB.

In the example of FIG. 4, when the voltage VA is equal to or greater than 0 V and equal to or less than 1 V (i.e., 0≤VA≤1), the value of the quantized signal DOUT is set to "00". When the quantized signal DOUT is "00", the reference voltage VB is set to "1 V". When the voltage VA is greater than 1 V and equal to or less than 2 V (i.e., 1<VA≤2), the value of the quantized signal DOUT is set to "01". When the quantized signal DOUT is "01", the reference voltage VB is set to "2 V".

When the voltage VA is greater than 2 V and equal to or less than 3 V (i.e., 2<VA≤3), the value of the quantized signal DOUT is set to "10". When the quantized signal DOUT is "10", the reference voltage VB is set to "3 V". When the voltage VA is greater than 3 V and equal to or less than 4 V (i.e., 3<VA≤4), the value of the quantized signal DOUT is set to "11". When the quantized signal DOUT is "11", the reference voltage VB is set to "4 V".

The operation of FIG. 4 is performed in every cycle T of the control signal CNT1. For example, the frequency of the clock CLK1 is four times the frequency of the control signal CNT1. In this case, steps S100 through S104, and S118 are executed in the first cycle of the clock CLK1 in every cycle T of the control signal CNT1.

Further, for example, steps S106 through S110, S114, S120 through S124, and S128 are executed in the second cycle of the clock CLK1 in every cycle T of the control signal CNT1. Namely, steps S100 through S110, S114, S118 through S124, and S128 are executed in the charging period FH (for example, the period FH where the control signal CNT1 is a high level).

Further, steps S112, S116, S126, and S130 are executed in the third cycle of the clock CLK1 in every cycle T of the control signal CNT1. Namely, steps S112, S116, S126, and S130 are executed first in the integrating period LH (for example, the period LH where the control signal CNT1 is a low level). Further, for example, the clock CLK1 may be the same clock as that of the clock CLK2 of FIG. 8.

In step S100, the quantized signal DOUT is set to "01", and the reference voltage VB is set to "2 V". For example, the memory DFF responds to a rising edge of the control signal CNT1 to set the quantized signal DOUT to "01".

Then, the level selector RSEL responds to the quantized signal DOUT set to "01", and selects the reference voltage of 2 V. By doing this, the reference voltage VB first to be received by the comparator CMP in the charging period FH is set to an intermediate value (2 V) of the range of plural reference voltages VB (1 V, 2 V, 3 V, and 4 V).

In step S102, the comparator CMP determines whether the output voltage VA output from the integrator 10 is equal to or less than 2 V (i.e., the voltage corresponding to the reference voltage VB selected by the level selector RSEL).

When determining that the voltage VA is equal to or less than 2 V (YES in step S102), the process goes to step S104. On the other hand, when determining that the voltage VA is greater than 2 V (NO in step S102), the process goes to step S118.

In step S104, the comparison signal CSIG is set to "0" and the quantized signal DSIG is set to "00". Here, the comparison signal CSIG set to "0" indicates that the voltage VA is equal to or less than the reference voltage VB.

For example, the comparator CMP sets the comparison signal CSIG to "0" because the voltage VA is equal to or less than the reference voltage VB. Then, the operator OPP sets the quantized signal DSIG to "00" because the comparison signal CSIG is set to "0".

In step S106, the quantized signal DOUT is set to "00", and the reference voltage is set to "1 V". For example, in response to the rising edge of the clock CLK1, the memory DFF outputs the quantized signal DSIG set to "00" and received from the operator OPP.

Namely, the memory DFF outputs the quantized signal DOUT generated by delaying the quantized signal DSIG set to "00". Further, in response to the quantized signal DOUT set to "00", the level selector RSEL selects the reference voltage VB of 1 V.

In step S108, the comparator CMP determines whether the output voltage VA output from the integrator 10 is equal to or less than 1 V (i.e., the reference voltage VB selected by the level selector RSEL).

When determining that the voltage VA is equal to or less than 1 V (YES in step S108), the process goes to step S110. On the other hand, when determining that the voltage VA is greater than 1 V (NO in step S108), the process goes to step S114.

In step S110, the comparison signal CSIG is set to "0" and the quantized signal DSIG is maintained at "00". For example, the comparator CMP sets the comparison signal CSIG to "0" because the voltage VA is equal to or less than the reference voltage VB. Then, the operator OPP sets the quantized signal DSIG to "00" because the comparison signal CSIG is set to "0".

In step S112, the quantized signal DOUT is set to "00", and the reference voltage is set to "1 V". For example, in response to the rising edge of the clock CLK1, the memory DFF outputs the quantized signal DSIG set to "00" and received from the operator OPP. Namely, the memory DFF outputs the quantized signal DOUT generated by delaying the quantized signal DSIG set to "00".

Further, in response to the quantized signal DOUT set to "00", the level selector RSEL selects the reference voltage VB of 1 V. By doing this, for example, the quantizer 20 outputs the quantized signal DOUT set to "00" and the reference voltage VB set to "1 V" when the voltage is equal to or less than 1 V.

In step S114, the comparison signal CSIG is set to "1" and the quantized signal DSIG is set to "01". Here, the comparison signal CSIG set to "1" indicates that the voltage VA is greater than the reference voltage VB. For example, the comparator CMP sets the comparison signal CSIG to "1" because the voltage VA is greater than the reference voltage VB. Then, the operator OPP adds "1" to the value ("00") of the quantized signal DSIG set in step S104 because the comparison signal CSIG is set to "1", and sets the quantized signal DSIG to "01".

In step S116, the quantized signal DOUT is set to "01", and the reference voltage is set to "2 V". For example, in response to the rising edge of the clock CLK1, the memory DFF outputs the quantized signal DSIG set to "01" and received from the operator OPP. Namely, the memory DFF outputs the quantized signal DOUT generated by delaying the quantized signal DSIG set to "01".

Further, in response to the quantized signal DOUT set to "01", the level selector RSEL selects the reference voltage VB of 2 V. By doing this, for example, the quantizer 20 outputs the quantized signal DOUT set to "01" and the reference voltage VB set to "2 V" when the voltage is greater than 1 V and equal to or less than 2 V.

In step S118, the comparison signal CSIG is set to "1" and the quantized signal DSIG is set to "10". For example, the comparator CMP sets the comparison signal CSIG to "1" because the voltage VA is greater than the reference voltage VB. Then, the operator OPP sets the quantized signal DSIG to "10" because the comparison signal CSIG is set to "1".

In step S120, the quantized signal DOUT is set to "10", and the reference voltage is set to "3 V". For example, in response to the rising edge of the clock CLK1, the memory DFF outputs the quantized signal DSIG set to "10" and received from the operator OPP. Namely, the memory DFF outputs the quantized signal DOUT generated by delaying the quantized signal DSIG set to "10".

Further, in response to the quantized signal DOUT set to "10", the level selector RSEL selects the reference voltage VB of 3 V.

In step S122, the comparator CMP determines whether the output voltage VA output from the integrator 10 is equal to or less than 3 V (i.e., the reference voltage VB selected by the level selector RSEL). When determining that the voltage VA is equal to or less than 3 V (YES in step S122), the process goes to step S124.

More specifically, when determining that the voltage VA is greater than 2 V and equal to or less than 3 V (YES in step S122), the process goes to step S124. On the other hand, when determining that the voltage VA is greater than 3 V (NO in step S122), the process goes to step S128.

In step S124, the comparison signal CSIG is set to "0" and the quantized signal DSIG is maintained at "10". For example, the comparator CMP sets the comparison signal CSIG to "0" because the voltage VA is equal to or less than the reference voltage VB. Then, the operator OPP maintains the quantized signal DSIG at "10" because the comparison signal CSIG is set to "0".

In step S126, the quantized signal DOUT is set to "10", and the reference voltage is set to "3 V". For example, in response to the rising edge of the clock CLK1, the memory DFF outputs the quantized signal DSIG set to "10" and received from the operator OPP. Namely, the memory DFF outputs the quantized signal DOUT generated by delaying the quantized signal DSIG set to "10".

Further, in response to the quantized signal DOUT set to "10", the level selector RSEL selects the reference voltage VB of 3 V. By doing this, for example, the quantizer 20 outputs the quantized signal DOUT set to "10" and the reference voltage VB set to "3 V" when the voltage is greater than 2 V and equal to or less than 3 V.

In step S128, the comparison signal CSIG is set to "1" and the quantized signal DSIG is set to "11". For example, the comparator CMP sets the comparison signal CSIG to "1" because the voltage VA is greater than the reference voltage VB.

Then, the operator OPP adds "1" to the value ("10") of the quantized signal DSIG set in step S118 because the comparison signal CSIG is set to "1", and sets the quantized signal DSIG to "11".

In step S130, the quantized signal DOUT is set to "11", and the reference voltage is set to "4 V". For example, in response to the rising edge of the clock CLK1, the memory DFF outputs the quantized signal DSIG set to "11" and received from the operator OPP. Namely, the memory DFF outputs the quantized signal DOUT generated by delaying the quantized signal DSIG set to "11".

Further, in response to the quantized signal DOUT set to "01", the level selector RSEL selects the reference voltage VB of 4 V. By doing this, for example, the quantizer 20 outputs the quantized signal DOUT set to "11" and the reference voltage VB set to "4 V" when the voltage is greater than 3 V and equal to or less than 4 V.

The values of the quantized signal DOUT and the reference voltage VB set in steps S112, S116, S126, and S130 are maintained until the integrating period LH is terminated (ends). For example, the operator OPP maintains the value of the quantized signal DOUT set in steps S110, S114, S124, and S128 until the integrating period LH is terminated.

Figure 8:
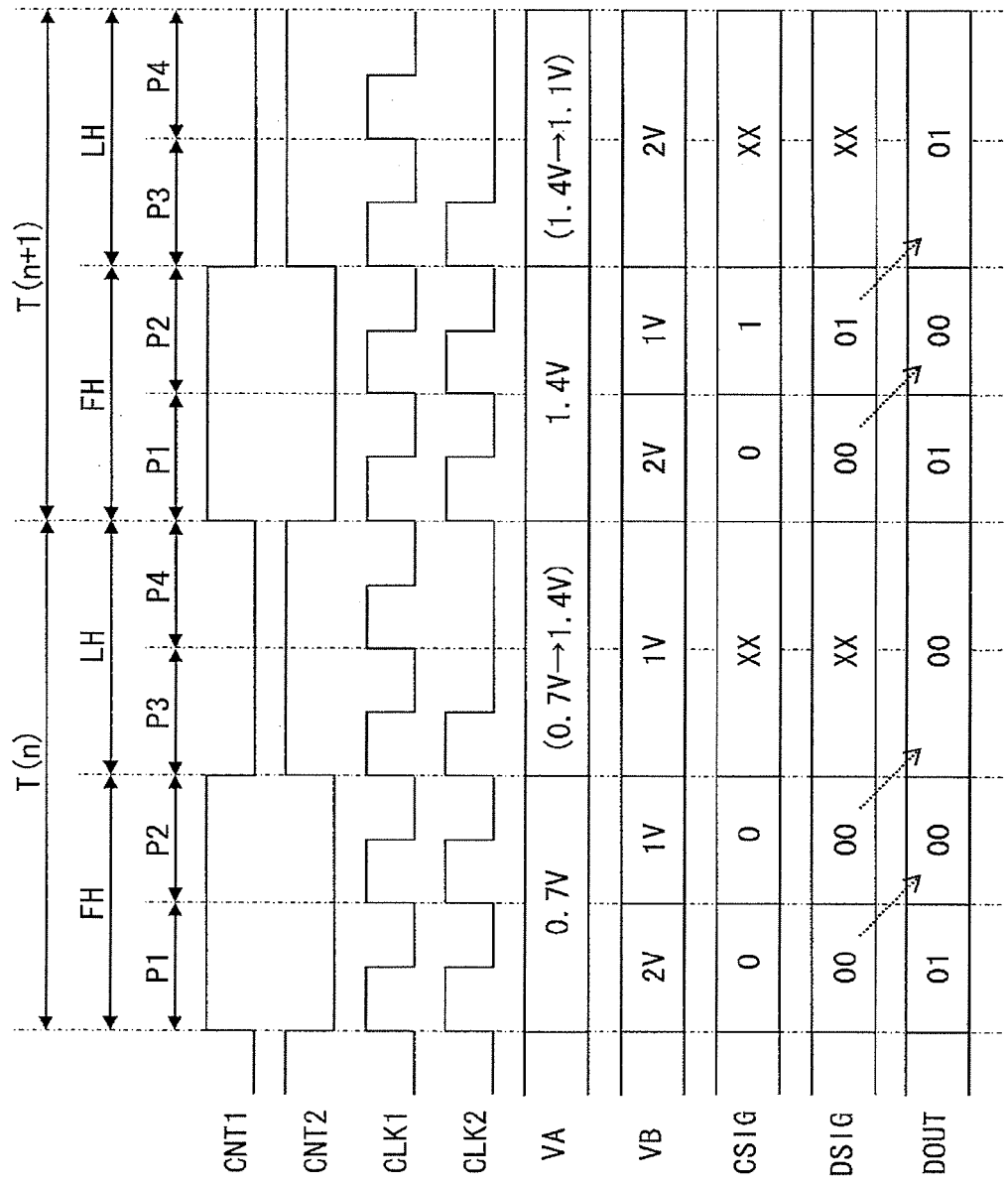
FIG. 8 illustrates an example operation timing of the quantizer of FIG. 7.

Further, in a case where the clock CLK1 is similar to the clock CLK2 of FIG. 8, the output signal (quantized signal) DSIG output from the operator OPP in the integrating period LH may be unstable.

As described above, according to this embodiment, the voltage VIN is quantized into the quantized signal DOUT having a plurality of bits by using the clock CLK1 having a cycle shorter than that of the charging period FH.

Due to the generation of the quantized signal DOUT having a plurality of bits, it may become possible to improve the signal-to-noise ratio (hereinafter may be simplified as an "SNR") of the modulator. For example, the quantized signal DOUT having a plurality of bits is generated by operating the quantizer 20 in synchronization with the CLK1.

Namely, according to this embodiment, it is not desired to operate the circuit (the integrator 10) other than the quantizer 20 of the modulator in high speed. Therefore, it may become possible to reduce the energy consumption when compared with the modulator where the sampling frequency is increased so as to operate the entire modulator in higher speed.

Further, in a configuration where the order of the ΔΣ modulation is increased in order to improve the output accuracy of the modulator, it may be desired to increase the processing speed in the stages. Therefore, the energy consumption of the modulator having such a configuration may become greater than that of the modulator as illustrated in FIG. 1. In other words, according to this embodiment, the energy consumption may be reduced when compared with the configuration where the number of the ΔΣ modulation is increased.

Figure 13:
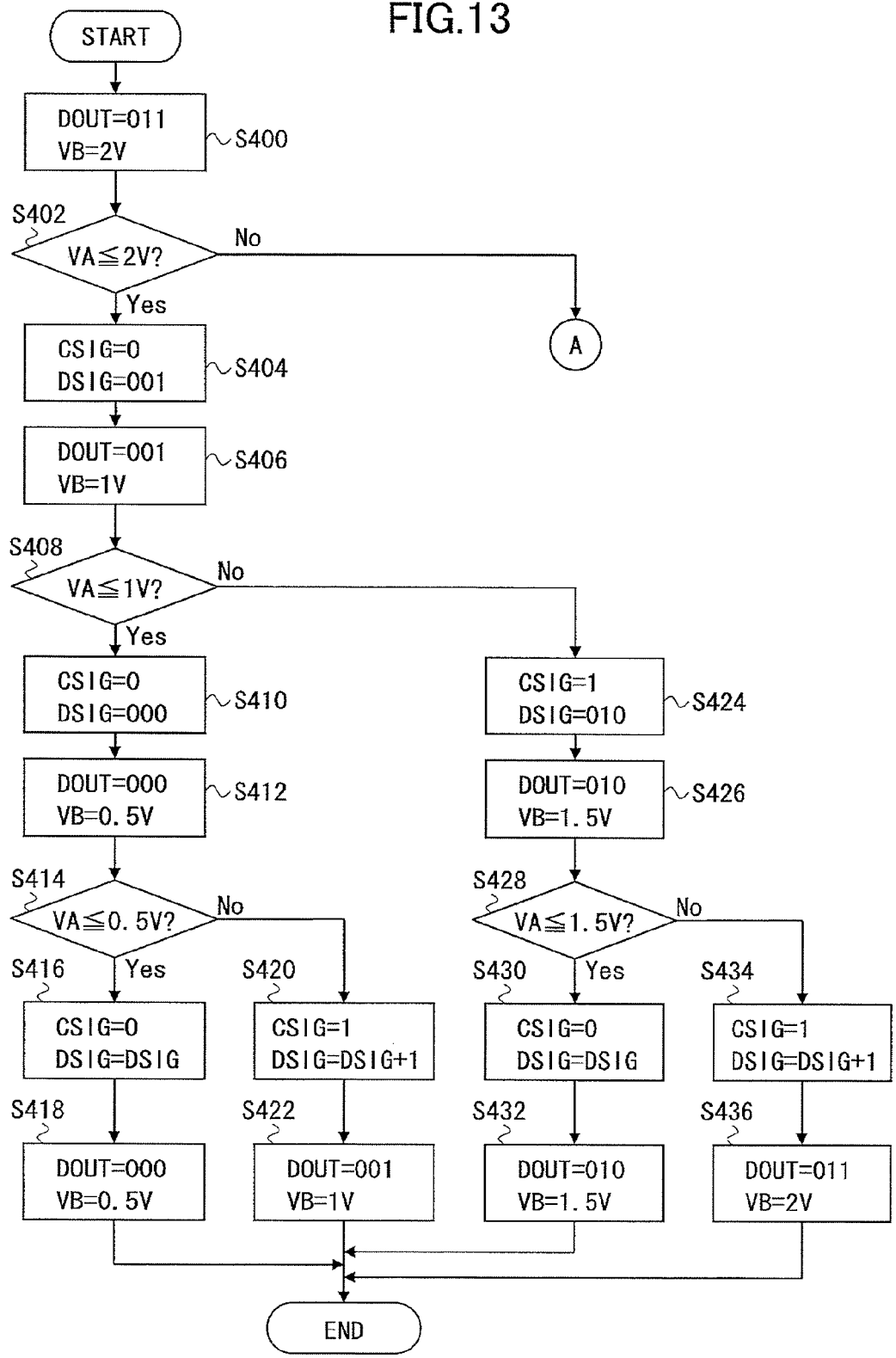
FIG. 13 illustrates another example operation of the quantizer of the above embodiment.
Figure 14:
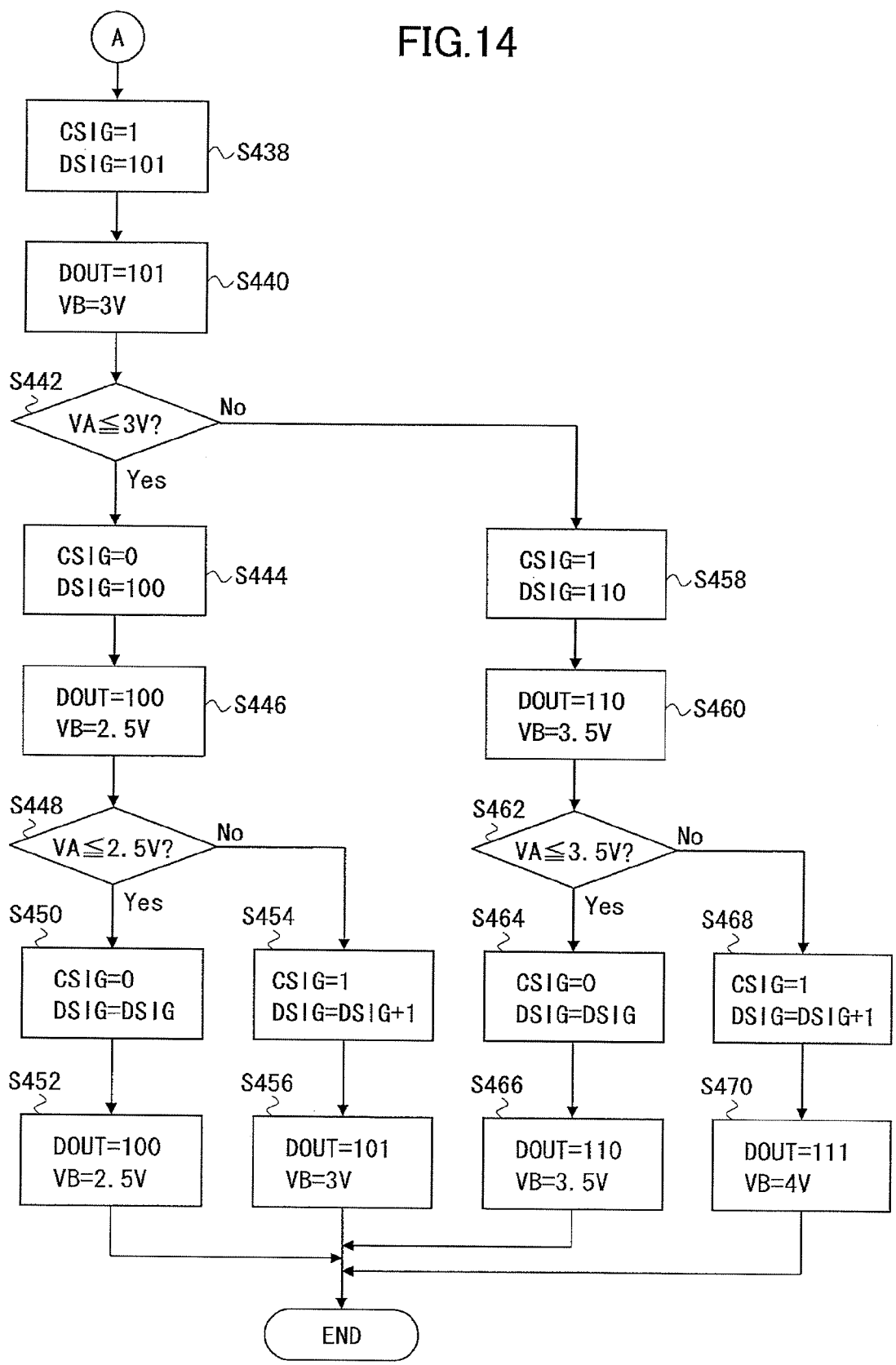
FIG. 14 illustrates the following operation of FIG. 13.

Further, the operation of the quantizer 20 of the present invention is not limited to the example operation described above. For example, the number of quantization level may be less than or more than 4. For example, as illustrated in FIGS. 13 and 14, the voltage VIN may be quantized into the quantized signal DOUT having three bits.

In a case of the quantization of the voltage VIN into the quantized signal DOUT having three or more bits, the quantizer 20 may repeat the comparison between the output voltage VA of the integrator 10 and the reference voltage VB selected by the level selector RSEL (steps S102 and the like) and the update of the reference voltage VB (steps S106, S120 and the like) to generate the quantized signal DSIG in the charging period FH.

Figure 5:
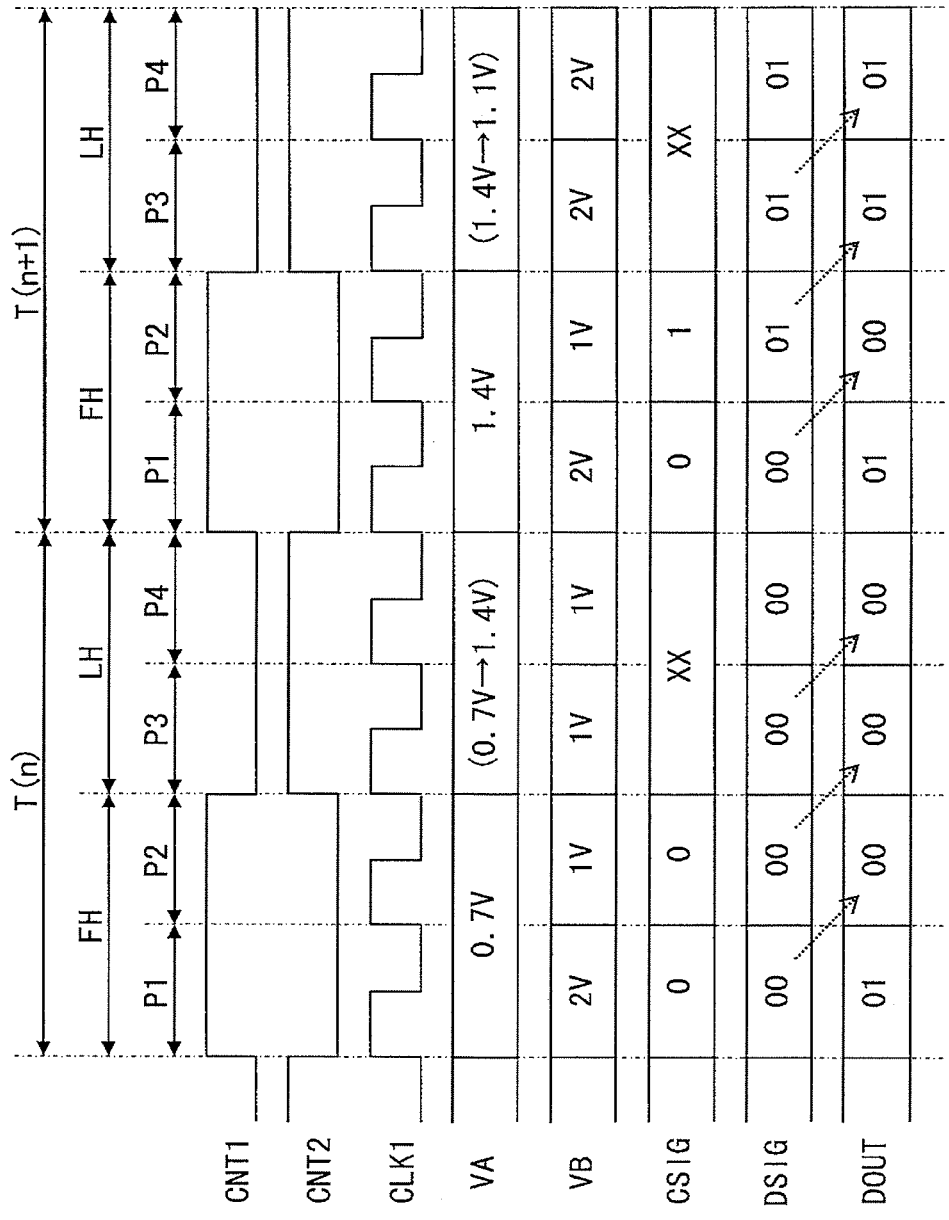
FIG. 5 illustrates an example operation timing of the quantizer of FIG. 3.

FIG. 5 is an example operation timing chart of the quantizer 20 of FIG. 3. More specifically, FIG. 5 illustrates the operation timing of the quantizer 20 when the input voltage VIN of the modulator is 1.7 V. The conditions of the quantization are same as those indicated in the remarks of FIG. 2. Namely, FIG. 5 illustrates an example operation of the signals of FIG. 4.

In FIG. 5, the signals CSIG, DSIG, and DOUT are expressed in a binary digit form. Further, the "XX" indicates an unstable value (state). Further, in FIG. 5, the voltage VA in the charging period FH indicates the value of the voltage VA confirmed in the integrating period LH of the previous cycle T, and the values in parentheses of the voltage VA in the integrating period LH indicates the first and the last values of the integrating period LH.

The cycle T(n) indicates nth cycle T of the control signal CNT1, and the cycle T(n+1) indicates the cycle T next to cycle T(n). Further, period P(i.e., P1 through P4) corresponds to the cycle of the clock CLK1. For example, the frequency of the clock CLK1 is four times the frequency of the control signal CNT1.

In period P1 (i.e., the first cycle of the clock CLK1) of the cycle T(n), the quantized signal DOUT is set to "01" and the reference voltage VB is set to "2 V".

Further, the voltage VA is maintained at, for example, 0.7 V. In this case, the voltage VA (0.7 V) is equal to or less than the reference voltage VB (2 V). Therefore, the comparison signal CSIG is set to "0". Because the comparison signal CSIG is "0", the quantized signal DSIG is set to "00".

In period P2 (i.e., the second cycle of the clock CLK1) of the cycle T(n), the quantized signal DOUT is set to "00" because the quantized signal DSIG in period P1 is "00". For example, in response to the rising edge of the clock CLK1, the memory DFF outputs quantized signal DSIG set to "00" in period P1.

By doing this, the quantized signal DOUT set to "00" is output from the memory DFF. Due to the quantized signal DOUT being set to "00", the reference voltage VB is set to "1 V". In this case, the voltage VA (0.7 V) is equal to or less than the reference voltage VB (1 V). Therefore, the comparison signal CSIG is set to "0". Because the comparison signal CSIG is "0", the quantized signal DSIG is set to "00".

The quantized signal DSIG ("00") generated in period P2 corresponds to the signal generated by quantizing the voltage VA (0.7 V). Namely, in this embodiment, the quantized signal DSIG of the voltage VA is generated in the charging period FH (i.e., periods P1 and P2).

In period P3 (i.e., the third cycle of the clock CLK1) of the cycle T(n), the quantized signal DOUT is set to "00" because the quantized signal DSIG in period P2 is "00". Further, due to the quantized signal DOUT being set to "00", the reference voltage VB is set to "1 V".

Based on this, in the beginning of the integrating period LH, the quantized signal DOUT ("00") and the reference voltage VB ("1 V") corresponding to the voltage VA ("0.7 V") are output from the quantizer 20. Further, in this embodiment, the quantized signal DSIG is maintained at the value ("00") of period P2 regardless of the value of the comparison signal CSIG.

In period P4 (i.e., the fourth cycle of the clock CLK1) of the cycle T(n), the quantized signal DOUT is set to "00" because the quantized signal DSIG in period P3 is "00". Further, due to the quantized signal DOUT being set to "00", the reference voltage VB is set to "1 V".

The quantized signal DSIG is maintained at, for example, the value ("00") of period P3. Further, the value of the quantized signal DSIG in period P4 may be unstable.

As described above, in the integrating period LH (i.e., in periods P3 and P4), the quantized signal DOUT is maintained at the value ("00") of the quantized signal DSIG in period P2 and the reference voltage VB is maintained at the voltage ("1 V") corresponding to the quantized signal DOUT.

Further, in the integrating period LH, the voltage VA changes to the voltage which is calculated based on the formula (5) described with reference to FIG. 1. For example, the voltage VA changes to a voltage (1.4 V) by adding the voltage VA (0.7 V) in the charging period FH to the difference voltage (0.7 V) between the voltage VIN (1.7 V) and the reference voltage VB (1 V). Namely, the voltage VA changes from 0.7 V to 1.4 V.

In period P1 (i.e., the first cycle of the clock CLK1) of the cycle T(n+1), the quantized signal DOUT is set to "01" and the reference voltage VB is set to "2 V". Further, the voltage VA is maintained at, for example, 0.7 V. In this case, the voltage VA (1.4 V) confirmed in the integrating period LH of the cycle T(n).

The voltage VA (1.4 V) is equal to or less than the reference voltage VB (2 V). Therefore, the comparison signal CSIG is set to "0". Because the comparison signal CSIG is "0", the quantized signal DSIG is set to "00".

In period P2 (i.e., the second cycle of the clock CLK1) of the cycle T(n+1), the quantized signal DOUT is set to "00" because the quantized signal DSIG in period P1 is "00". Due to the quantized signal DOUT being set to "00", the reference voltage VB is set to "1 V".

In this case, the voltage VA (1.4 V) is greater than the reference voltage VB (1 V). Therefore, the comparison signal CSIG is set to "1". Due to the comparison signal CSIG being set to "1", the quantized signal DSIG is set to a value "01" which is determined by adding the value "1" to the value ("00") of the quantized signal DSIG in period P1. The quantized signal DSIG ("01") generated in period P2 corresponds to a signal generated by quantizing the voltage VA (1.4 V).

In period P3 (i.e., the third cycle of the clock CLK1) of the cycle T(n+1), the quantized signal DOUT is set to "01" because the quantized signal DSIG in period P2 is "01". Further, due to the quantized signal DOUT being set to "01", the reference voltage VB is set to "2 V".

Based on this, in the beginning of the integrating period LH, the quantized signal DOUT ("01") and the reference voltage VB ("2 V") corresponding to the voltage VA ("1.4 V") are output from the quantizer 20. Further, in this embodiment, the quantized signal DSIG is maintained at the value ("01") of period P2 regardless of the value of the comparison signal CSIG.

In period P4 (i.e., the fourth cycle of the clock CLK1) of the cycle T(n+1), the quantized signal DOUT is set to "01" because the quantized signal DSIG in period P3 is "01". Further, due to the quantized signal DOUT being set to "01", the reference voltage VB is set to "1 V". The quantized signal DSIG is maintained at, for example, the value ("01") of period P3. Further, the value of the quantized signal DSIG in period P4 may be unstable.

As described above, in the integrating period LH (i.e., in periods P3 and P4), the quantized signal DOUT is maintained at the value ("02") of the quantized signal DSIG in period P2 and the reference voltage VB is maintained at the voltage ("2 V") corresponding to the quantized signal DOUT.

Further, in the integrating period LH, the voltage VA changes from 1.4 V to 1.1 V. For example, the voltage VA changes to a voltage (1.1 V) by adding the voltage VA (1.4 V) in the charging period FH to the difference voltage (−0.3 V) between the voltage VIN (1.7 V) and the reference voltage VB (2 V).

As described above, in this embodiment, the quantized signal DOUT and the reference voltage VB are output in the timing substantially equal to the timing of starting the integrating period LH.

Therefore, it may become possible for the integrator 10 to integrate the differential voltage between the input voltage VIN and the reference voltage VB without any difficulties.

Here, the number of the clocks of the clock CLK1 in the charging period FH may be the number determined by adding "1" to the number of bits of the quantized signal DOUT. Further, for example, in the operation of FIG. 5, the frequency of the clock CLK1 may be six times the frequency of the control signal CNT1.

In this case, the operation of the period P3 is executed in the charging period FH. As a result, the quantizer 20 may output the quantized signal DOUT and the reference voltage VB corresponding to the voltage VA before the beginning of the integrating period LH.

Further, in the case where the frequency of the clock CLK1 is six times the frequency of the control signal CNT1, it may be desired to increase the operation speed of the quantizer 20 when compared with the case where the frequency of the clock CLK1 is four times the frequency of the control signal CNT1.

Therefore, the energy consumption may also be increased. Accordingly, in this embodiment, for example, the number of clocks of the clock CLK1 in the charging period FH is equal to the number of bits of the quantized signal DOUT, it may become possible to generate the quantized signal having a plurality of bits while the increase of the energy consumption is better controlled.

Figure 6:
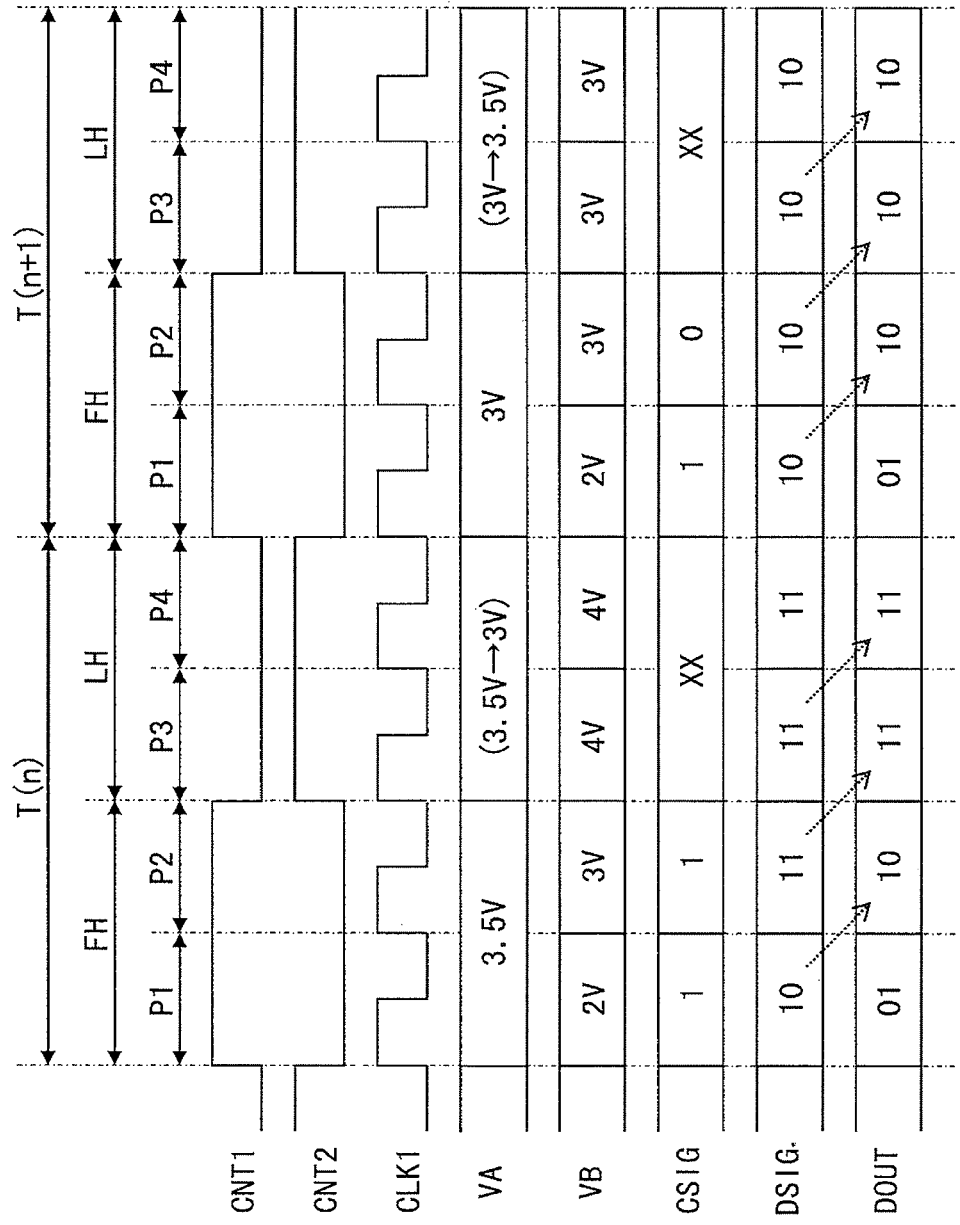
FIG. 6 illustrates another example operation timing of the quantizer of FIG. 3.

FIG. 6 is another example operation timing chart of the quantizer 20 of FIG. 3. More specifically, FIG. 6 illustrates the operation timing of the quantizer 20 when the input voltage VIN of the modulator is 3.5 V. The conditions of the quantization are same as those indicated in the remarks of FIG. 2.

Namely, FIG. 6 illustrates an example operation of the signals of FIG. 4. The meanings of the symbols such as "XX" in FIG. 6 are the same as those in FIG. 5. Further, detailed description of the operation already described with reference to FIG. 5 may be herein omitted.

In period P1 of the cycle T(n), the quantized signal DOUT is set to "01" and the reference voltage VB is set to "2 V". Further, the voltage VA is maintained at, for example, 3.5 V. In this case, the voltage VA (3.5 V) is greater than the reference voltage VB (2 V). Therefore, the comparison signal CSIG is set to "1". Because the comparison signal CSIG is "1", the quantized signal DSIG is set to "10".

In period P2 of the cycle T(n), the quantized signal DOUT is set to "10" because the quantized signal DSIG in period P1 is "10". Due to the quantized signal DOUT being set to "10", the reference voltage VB is set to "3 V". In this case, the voltage VA (3.5 V) is greater than the reference voltage VB (3 V).

Therefore, the comparison signal CSIG is set to "1". Due to the comparison signal CSIG being set to "1", the quantized signal DSIG is set to a value "11" which is determined by adding the value "1" to the value ("10") of the quantized signal DSIG in period P1. The quantized signal DSIG ("11") generated in period P2 corresponds to a signal generated by quantizing the voltage VA (3.5 V).

In period P3 of the cycle T(n), the quantized signal DOUT is set to "11" because the quantized signal DSIG in period P2 is "11". Further, due to the quantized signal DOUT being set to "11", the reference voltage VB is set to "4 V". Based on this, in the beginning of the integrating period LH, the quantized signal DOUT ("11") and the reference voltage VB ("4 V") corresponding to the voltage VA ("3.5 V") are output from the quantizer 20.

Further, the values of the quantized signals DSIG and DOUT and the reference voltage VB are maintained until the end of the integrating period LH. Further, in the integrating period LH, the voltage VA changes to the voltage calculated based on the formula (5) described with reference to FIG. 1. Namely, the voltage VA changes from 3.5 V to 3 V.

In period P1 of the cycle T(n+1), the quantized signal DOUT is set to "01" and the reference voltage VB is set to "2 V". Further, the voltage VA is maintained at the voltage (3 V) confirmed in the in the integrating period LH of the cycle T(n).

The voltage VA (3 V) is greater than the reference voltage VB (2 V). Therefore, the comparison signal CSIG is set to "1". Because the comparison signal CSIG is "1", the quantized signal DSIG is set to "10".

In period P2 of the cycle T(n+1), the quantized signal DOUT is set to "10" because the quantized signal DSIG in period P1 is "10". Due to the quantized signal DOUT being set to "10", the reference voltage VB is set to "3 V". In this case, the voltage VA (3 V) is equal to or less than the reference voltage VB (3 V).

Therefore, the comparison signal CSIG is set to "0". Due to the comparison signal CSIG being set to "0", the quantized signal DSIG is maintained at that value "10". The quantized signal DSIG ("10") generated in period P2 corresponds to a signal generated by quantizing the voltage VA (3 V).

In period P3 of the cycle T(n+1), the quantized signal DOUT is set to "10" because the quantized signal DSIG in period P2 is "10". Further, due to the quantized signal DOUT being set to "10", the reference voltage VB is set to "3 V".

Based on this, in the beginning of the integrating period LH, the quantized signal DOUT ("10") and the reference voltage VB ("3 V") corresponding to the voltage VA ("3 V") are output from the quantizer 20. Further, the quantized signals DSIG and DOUT and the reference voltage VB are maintained until the end of the integrating period LH. Further, in the integrating period LH, the voltage VA changes from 3 V to 3.5 V.

As described above, according to this embodiment, the modulator includes the quantizer 20 to quantizes the voltage VA into the quantized signal DSIG having a plurality of bits in the charging period FH.

For example, the quantizer 20 divides one cycle T of the control signal CNT1 in time domain using the clock CLK1, so as to update the reference voltage VB in every divided time period (i.e., in every cycle of the clock CLK1). By doing this, according to this embodiment, the quantized signal DSIG corresponding to the voltage VA may be generated within the charging period FH (corresponding to two cycles of the clock CLK1).

Further, in this embodiment, the quantizer 20 outputs the reference voltage VB to be used for the quantization of the voltage VA to the integrator 10. By doing this, according to this embodiment, it becomes possible to remove the D/A converter to generate the reference voltage VB to be used in the integrator 10. As a result, the increase of the circuit scale may be better controlled.

Namely, according to this embodiment, it becomes possible to generate the quantized signal having a plurality of bits while the increase of the circuit scale is better controlled. Further, according to this embodiment, due to the better control of the increase of the circuit scale, the increase of the current consumption may also be better controlled.

Figure 7:
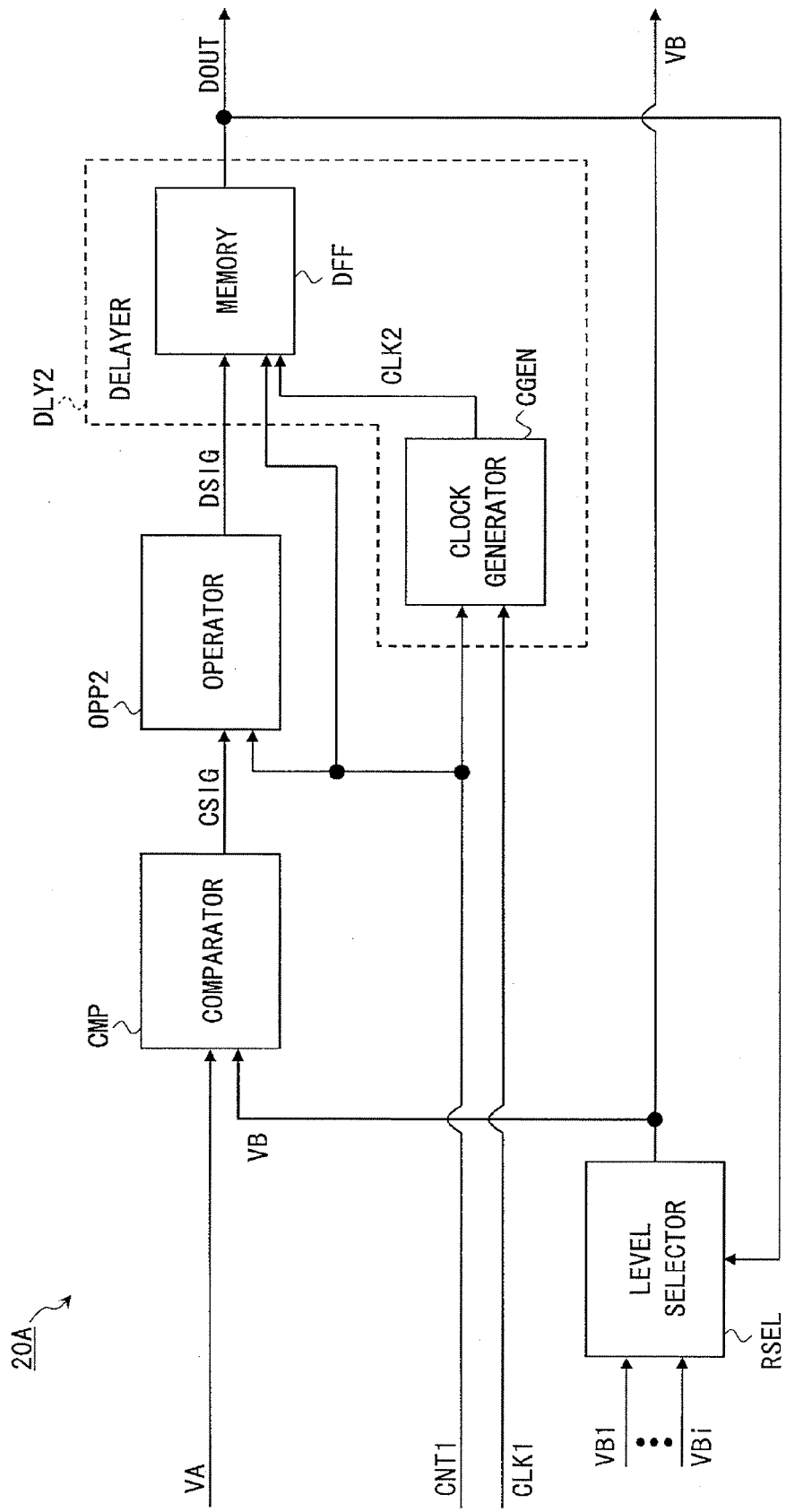
FIG. 7 illustrates another example configuration of the quantizer of FIG. 1.

FIG. 7 illustrates an example configuration of a quantizer 20A according to another embodiment. The same signs are also used to describe the same or equivalent elements in the embodiment described above, and the repeated description thereof may be omitted.

The modulator according to this embodiment is the same as the modulator described in the above embodiment except that the quantizer 20A is used instead of the quantizer 20. As illustrated in FIG. 7, the quantizer 20A includes an operator OPP2 and the delayer DLY2 instead of the operator OPP and the delayer DLY, respectively, of FIG. 3. Besides those elements, the configuration of the quantizer 20A is the same as that of the quantizer 20.

Further, the operations of the quantizer 20A are substantially the same as those of the quantizer 20 except for the operation of a clock generator CGEN and the operation of the operator OPP2 in the integrating period LH.

For example, in the operation of the quantizer 20A, the process (operation) of the quantized signal DSIG in the integrating period LH differs from the operation of the quantizer 20. Further, the outline of the operations of the quantizer 20A is described in the flowchart of FIG. 4.

The quantizer 20A includes, for example, the level selector RSEL, the comparator CMP, the operator OPP2, and the delayer DLY2. The delayer DLY2 includes, for example, the clock generator CGEN and the memory DFF.

The clock generator CGEN receives the control signal CNT1 and the clock CLK1, and generates a clock CLK2. The clock CLK2 is the same as the clock CLK1 except that the second and the following clocks (pulses) are omitted (excluded) in the integrating period LH (see FIG. 8).

Therefore the number of the clocks of the clock CLK2 in the charging period FH is the same as the number of bits of the quantized signal DOUT and the number of clocks of the clock CLK2 in the integrating period LH is one.

For example, the clock CLK2 is generated by a logical AND operation between the clock CLK1 and an enable signal which is the result of a logical OR operation between the control signal CNT1 and a signal which is generated by delaying the clock CLK1 by one cycle. Namely, the clock generator CGEN generates the clock CL2 by using the clock CLK1. Further, the clock generator CGEN outputs the clock CLK2 to the memory DFF.

The configuration of the memory DFF is the same as that of the memory DFF in FIG. 3. Further, the memory DFF in this embodiment receives the clock CLK2 instead of the clock CLK1. Accordingly, the memory DFF operates in synchronization with the clock CLK2.

The operator OPP2 receives, for example, the control signal CNT1 and the comparison signal CSIG, and generates the quantized signal DSIG. For example, the operator OPP2 generates the quantized signal DSIG based on the comparison signal CSIG received in the charging period FH. Then, the operator OPP2 outputs the quantized signal DSIG to the delayer DLY2.

Further, in this embodiment, the memory DFF operates in synchronization with the clock CLK2. Therefore, the quantized signal DSIG and the reference voltage VB are maintained until the end of the integrating period LH regardless of the value of the quantized signal DSIG in the integrating period LH. Therefore, in this embodiment, it is not desired for the operator OPP2 to maintain the value of the quantized signal DSIG in the integrating period LH, the value of the quantized signal DSIG being confirmed in the charging period FH.

Further, the configuration of the quantizer 20A according to the embodiment is not limited to the configuration described above. For example, the quantizer 20A may receive the clock CLK2 instead of the clock CLK1 from outside of the modulator. In this case, it is not desired to provide the clock generator CGEN in the modulator. Therefore, the circuit scale of the modulator may be reduced.

FIG. 8 is an example operation timing chart of the operation of the quantizer 20A of FIG. 7. More specifically, FIG. 8 illustrates the operation timing of the quantizer 20A when the input voltage VIN of the modulator is 1.7 V. The conditions of the quantization are same as those indicated in the remarks of FIG. 2.

Namely, FIG. 8 illustrates an example operation of the signals of FIG. 4. The meanings of the symbols such as "XX" in FIG. 8 are the same as those in FIG. 5. Further, detailed description of the operation already described with reference to FIG. 5 may be herein omitted.

The operation timing of the quantizer 20A in the charging period FH (i.e., periods P1 and P2) is the same as that of the quantizer 20 of FIG. 5 except for the clock CLK2. Therefore, in this embodiment as well, the quantized signal DSIG of the voltage VA is generated in the charging period FH (periods P1 and P2).

Further, the clock CLK2 in the charging period FH (periods P1 and P2) is the same as the clock CLK1. For example, in period P2 of the cycle T(n), in response to the rising edge of the clock CLK2, the memory DFF outputs the quantized signal DSIG ("00") set in period P1.

The operation timing of the quantizer 20A in the integrating period LH (i.e., periods P3 and P4) is the same as that of the quantizer 20 of FIG. 5 except for the clock CLK2 and the quantized signal DSIG.

For example, the clock CLK2 in the integrating period LH (periods P3 and P4) is maintained at a low level until the end of the integrating period LH since a single clock (pulse) is generated at the beginning of the integrating period LH.

Therefore, in period P3, the quantized signal DSIG in period P2 is output as the quantized signal DOUT. Then, the quantized signal DOUT output in period P3 is maintained until the end of the integrating period LH. Therefore, the reference voltage VB is also maintained until the end of the integrating period LH.

For example, in period P3 of the cycle T(n), in response to the rising edge of the clock CLK2, the memory DFF outputs the quantized signal DOUT ("00") set in period P2. Namely, in period P3 of the cycle T(n), the memory DFF outputs the quantized signal DOUT ("00") generated by quantizing the voltage VA (0.7 V).

Due to the quantized signal DOUT being set to "00", the reference voltage VB is set to "1 V". Further, in period P4 of the cycle T(n), the clock CLK2 is maintained at a low level. Therefore, the values of the quantized signal DOUT and the reference voltage VB are maintained at "00" and "1 V", respectively.

As described above, in this embodiment as well, in the integrating period LH (periods P3 and P4) of the cycle T(n), the quantized signal DOUT is maintained at "00" which is the value of the quantized signal DSIG in period P2 and the reference voltage VB is also maintained at "1 V" corresponding to the value of the quantized signal DOUT.

In the same manner, in the integrating period LH (periods P3 and P4) of the cycle T(n+1), the quantized signal DOUT is maintained at "01" which is the value of the quantized signal DSIG in period P2 and the reference voltage VB is also maintained at "2 V" corresponding to the value of the quantized signal DOUT.

Figure 9:
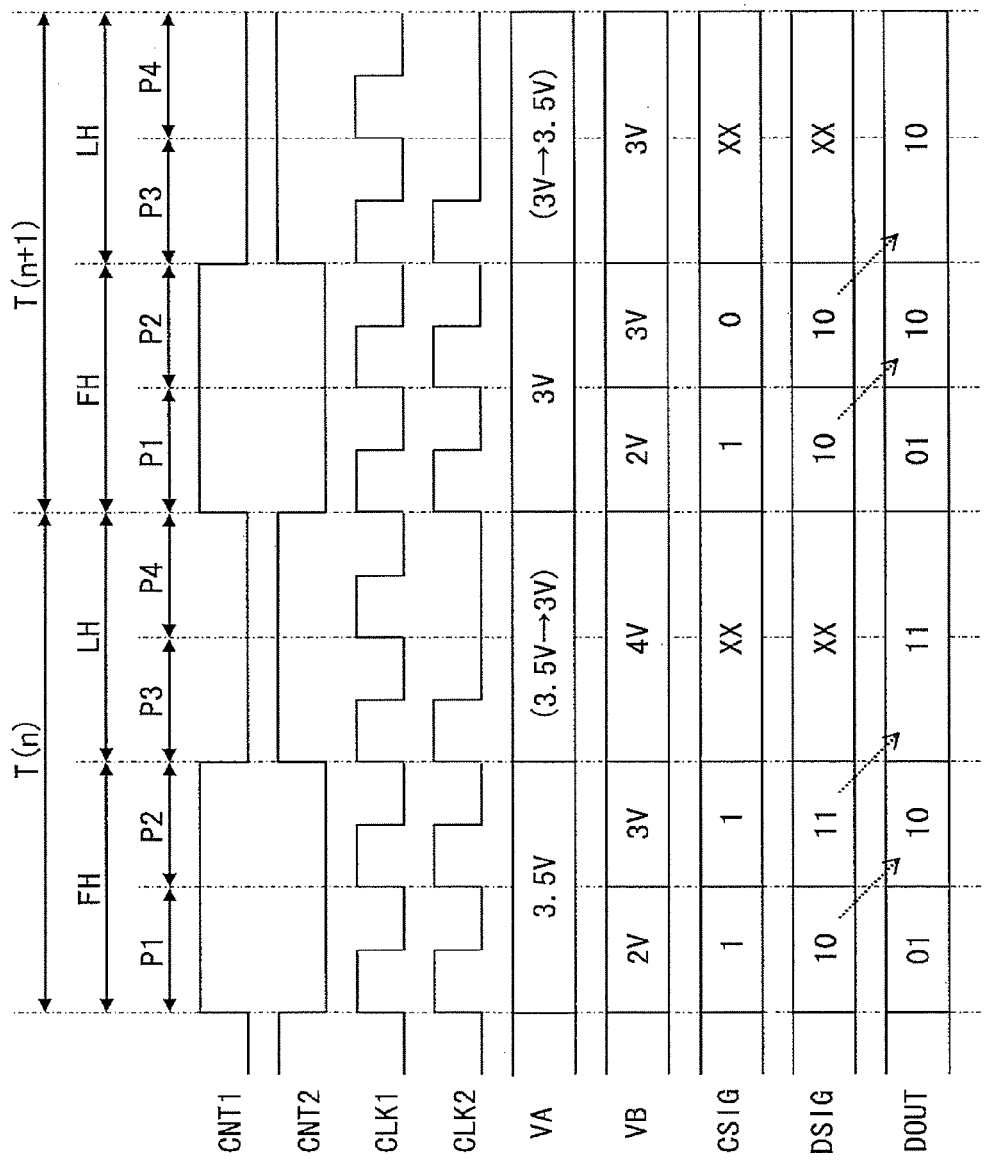
FIG. 9 illustrates another example operation timing of the quantizer of FIG. 7.

FIG. 9 is another example operation timing chart of the operation of the quantizer 20A of FIG. 7. More specifically, FIG. 9 illustrates the operation timing of the quantizer 20A when the input voltage VIN of the modulator is 3.5 V. The conditions of the quantization are same as those indicated in the remarks of FIG. 2.

Namely, FIG. 9 illustrates an example operation of the signals of FIG. 4. The meanings of the symbols such as "XX" in FIG. 9 are the same as those in FIG. 5. Further, detailed description of the operation already described with reference to FIGS. 5, 6, and 8 may be herein omitted. For example, the clock CL2 is the same as the clock CLK2 already described with reference to FIG. 8.

The operation timing of the quantizer 20A in the charging period FH (i.e., periods P1 and P2) is the same as that of the quantizer 20 of FIG. 6 except for the clock CLK2. The operation timing of the quantizer 20A in the integrating period LH (i.e., periods P3 and P4) is the same as that of the quantizer 20 of FIG. 6 except for the clock CLK2 and the quantized signal DSIG.

For example, in period P3 of the cycle T(n), in response to the rising edge of the clock CLK2, the memory DFF outputs the quantized signal DOUT ("11") set in period P2. Namely, in period P3 of the cycle T(n), the memory DFF outputs the quantized signal DOUT ("11") generated by quantizing the voltage VA (3.5 V).

Due to the quantized signal DOUT being set to "11", the reference voltage VB is set to "4 V". Further, in period P4 of the cycle T(n), the clock CLK2 is maintained at a low level. Therefore, the values of the quantized signal DOUT and the reference voltage VB are maintained at "11" and "4 V", respectively.

For example, in period P3 of the cycle T(n+1), in response to the rising edge of the clock CLK2, the memory DFF outputs the quantized signal DOUT ("10") set in period P2. Namely, in period P3 of the cycle T(n+1), the memory DFF outputs the quantized signal DOUT ("10") generated by quantizing the voltage VA (3 V).

Due to the quantized signal DOUT being set to "10", the reference voltage VB is set to "3 V". Further, in period P4 of the cycle T(n+1), the clock CLK2 is maintained at a low level. Therefore, the values of the quantized signal DOUT and the reference voltage VB are maintained at "10" and "3 V", respectively.

As described above, in the integrating period LH (periods P3 and P4), the quantized signal DOUT is maintained at the value of the quantized signal DSIG in period P2, and the reference voltage VB is also maintained at a voltage corresponding to the quantized signal DOUT.

As described above, in this embodiment, the same effect as that in the embodiment described before this embodiment may also be achieved. Further, in this embodiment, it is not desired for the operator OPP2 to maintain the value of the quantized signal DSIG in the integrating period LH, the value of the quantized signal DSIG being confirmed in the charging period FH. Therefore, the logic (pattern) of the operator OPP2 may be simplified.

Figure 10:
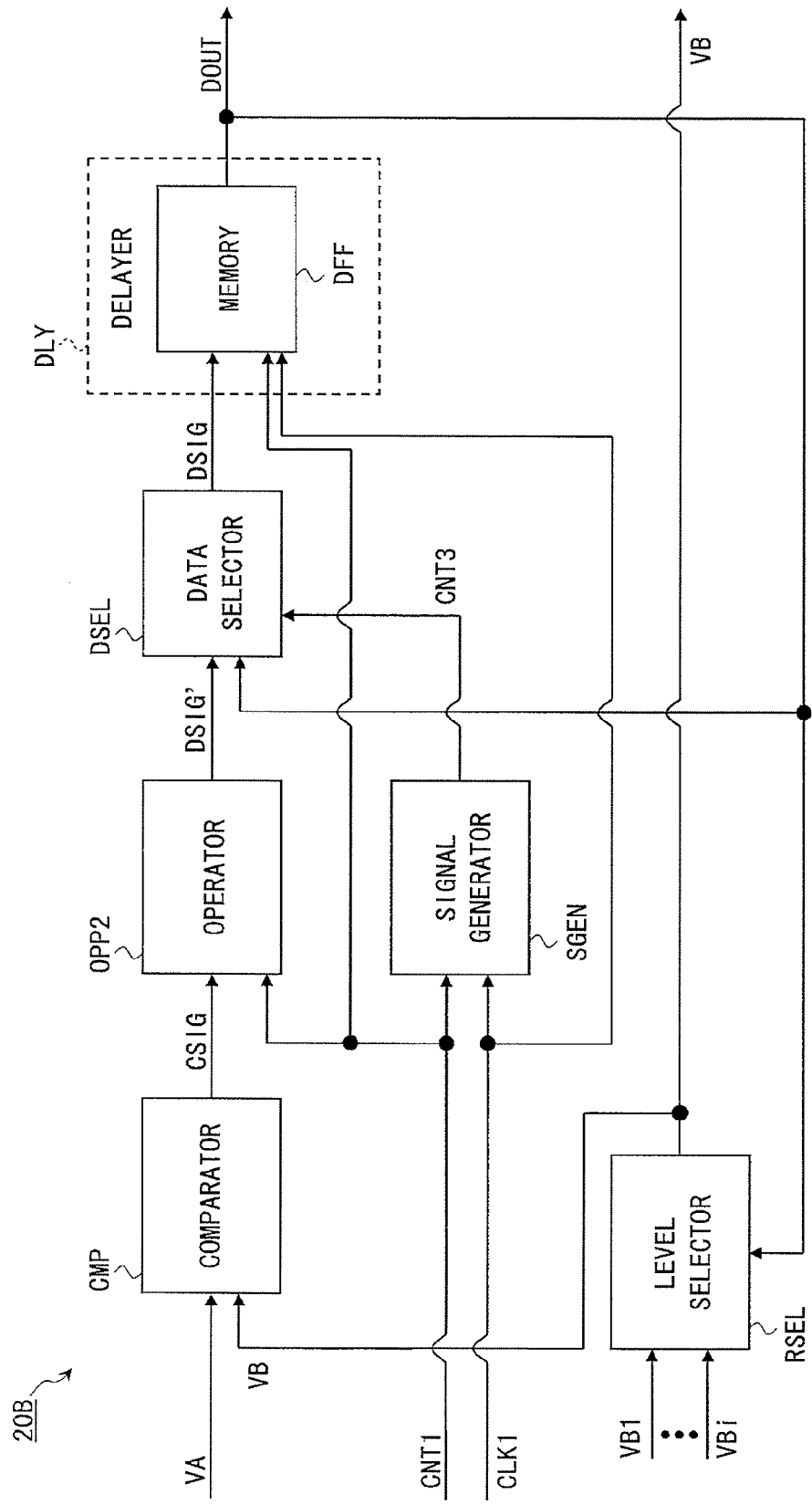
FIG. 10 illustrates another example configuration of the quantizer of FIG. 1.

FIG. 10 illustrates an example configuration of a quantizer 20B according to another embodiment. The same signs are also used to describe the same or equivalent elements in the embodiments described above, and the repeated description thereof may be omitted. The modulator according to this embodiment is the same as the modulator in the above embodiment with reference to FIGS. 1 through 6 except that the quantizer 20B is used instead of the quantizer 20.

As illustrated in FIG. 10, the quantizer 20B includes a data selector DSEL, a signal generator SGEN and an operator OPP2 instead of the operator OPP. Besides those elements, the configuration of the quantizer 20B is the same as that of the quantizer 20.

Further, the operations of the quantizer 20B are substantially the same as those of the quantizer 20 except for the operations of the signal generator SGEN, the data selector DSEL and the operation of the operator OPP2 in the integrating period LH.

For example, the outline of the operation of the quantizer 20B is described based on the operation described with reference to FIG. 4 by replacing the quantized signal DSIG of FIG. 4 by quantized signal DSIG'. Further, in FIG. 10, the symbol "DSIG'" refers to the output signal of the operator OPP2, and the symbol "DSIG" refers to the output signal of the data selector DSEL.

The quantizer 20B includes, for example, the signal generator SGEN, the level selector RSEL, the comparator CMP, the operator OPP2, the data selector DSEL, and the delayer DLY. For example, the operator OPP2 is the same as the operator OPP2 of the quantizer 20A in FIG. 7.

The signal generator SGEN receives the control signal CNT1 and the clock CLK1, and generates a data selection signal CNT3 (hereinafter may also be referred to as a "control signal CNT3"). The signal generator SGEN outputs the data selection signal CNT3 to the data selector DSEL.

For example, the signal generator SGEN asserts the control signal CNT3 after the timing when the quantized signal DSIG is first acquired by the memory DFF in the integrating period LH and before the timing when the quantized signal DSIG is secondly acquired by the memory DFF in the integrating period LH.

Then, the signal generator SGEN negates the control signal CNT3 after the timing when the quantized signal DSIG is last acquired by the memory DFF in the integrating period LH and before the end of the integrating period LH.

The data selector DSEL receives the quantized signals DSIG' and DOUT and the control signal CNT3 from the operator OPP2, the memory DFF, and the signal generator SGEN, respectively. Then, the data selector DSEL selects either the quantized signal DSIG' or the quantized signal DOUT based on the control signal CNT3, and outputs the selected signal to the memory DFF as the quantized signal DSIG.

For example, when the control signal CNT3 is negated, the data selector DSEL outputs the quantized signals DSIG' to the memory DFF, the quantized signals DSIG' being received from the operator OPP2. On the other hand, when the control signal CNT3 is asserted, the data selector DSEL outputs the quantized signal DOUT to the memory DFF, the quantized signal DOUT being received from the memory DFF.

By doing this, the quantized signals DSIG acquired by the memory DFF in the integrating period LH is set to have a value of the quantized signals DSIG' confirmed in the charging period FH. Therefore, in the integrating period LH, the quantized signal DOUT is maintained at the value of the quantized signals DSIG' confirmed in the charging period FH, and the reference voltage VB is also maintained at the value corresponding to the quantized signal DOUT.

Further, the configuration of the quantizer 20B according to the embodiment is not limited to the configuration described above. For example, the quantizer 20B may receive the clock CLK3 from outside of the modulator. In this case, it is not desired to provide the signal generator SGEN in the modulator.

Therefore, the circuit scale of the modulator may be reduced. Further, the signal generator SGEN and the data selector DSEL may be provided (formed) in the operator OPP2. The operation of the operator OPP2 including the signal generator SGEN and the data selector DSEL is the same as that operator OPP of FIG. 3 except that, for example, the quantized signal DOUT is received from the memory DFF.

Figure 11:
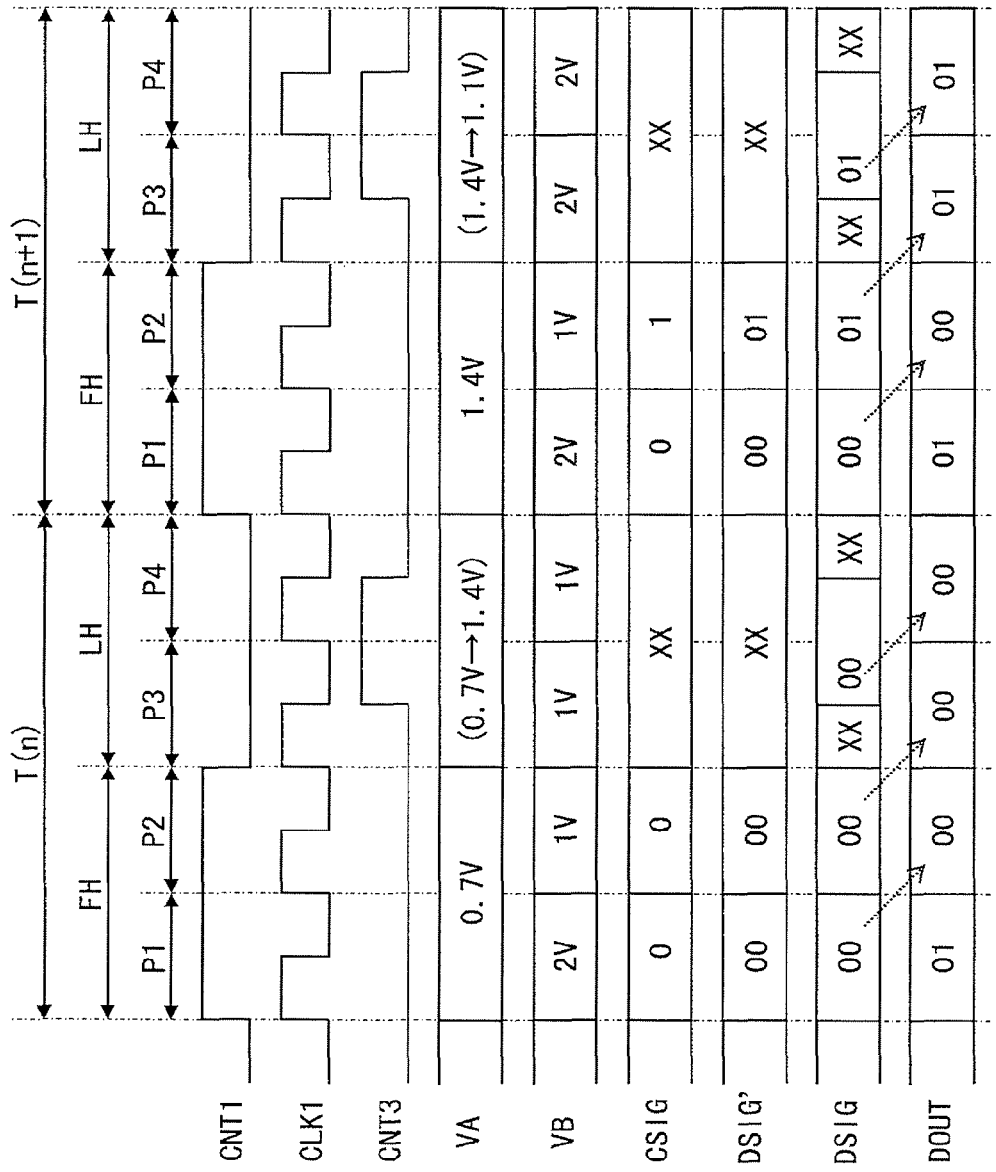
FIG. 11 illustrates an example operation timing of the quantizer of FIG. 10.

FIG. 11 is an example operation timing chart of the operation of the quantizer 20B of FIG. 10. More specifically, FIG. 11 illustrates the operation timing of the quantizer 20B when the input voltage VIN of the modulator is 1.7 V. The conditions of the quantization are same as those indicated in the remarks of FIG. 2.

Namely, FIG. 11 illustrates an example operation of the signals of FIG. 4. The meanings of the symbols such as "XX" in FIG. 11 are the same as those in FIG. 5. Further, detailed description of the operation already described with reference to FIG. 5 may be herein omitted.

The control signal CNT3 is maintained at a low level in the charging period FH (periods P1 and P2) and until the middle of period P3. For example, the control signal CNT3 changes from the low level to a high level in synchronization with the first falling edge of the clock CLK1 in the integrating period LH. After that, the control signal CNT3 is maintained at the high level until the middle of period P4.

For example, the control signal CNT3 changes from the high level to the low level in synchronization with the last falling edge of the clock CLK1 in the integrating period LH. After that, the control signal CNT3 is maintained at the low level until the end of the integrating period LH.

Further, for example, when the control signal CNT3 is the low level, the data selector DSEL outputs the quantized signals DSIG' to the memory DFF as the quantized signal DSIG, the quantized signals DSIG' being received from the operator OPP2. On the other hand, for example, when the control signal CNT3 is the high level, the data selector DSEL outputs the quantized signal DOUT to the memory DFF as the quantized signal DSIG, the quantized signal DOUT being received from the memory DFF.

The operation timing of the quantizer 20B in the charging period FH (periods P1 and P2) is the same as that of the quantizer 20 of FIG. 5 except for the control signal CNT3 and the quantized signal DSIG'. Therefore, in this embodiment as well, the quantized signals DSIG and DSIG' of the voltage VA is generated in the charging period FH (periods P1 and P2).

Further, in the charging period FH, the memory DFF receives the output signal DSIG' of the operator OPP2 as the quantized signal DSIG. For example, in period P2 of the cycle T(n), the data selector DSEL outputs the quantized signal DSIG' ("00") to the memory DFF as the quantized signal DSIG, the quantized signal DSIG' being received from the operator OPP2.

The operation timing of the quantizer 20B in the integrating period LH (periods P3 and P4) is the same as that of the quantizer 20 of FIG. 5 except for the control signal CNT3 and the quantized signals DSIG' and DSIG.

Therefore, in the integrating period LH, the quantized signal DOUT is maintained at the value determined by quantizing the voltage VA in the charging period FH and the reference voltage VB is also maintained at the voltage corresponding to the quantized signal DOUT.

For example, in period P3 of the cycle T(n), in response to the rising edge of the clock CLK1, the memory DFF outputs the quantized signal DSIG ("00") received from the data selector DSEL in period P2.

Namely, in period P3 of the cycle T(n), the memory DFF outputs the quantized signal DOUT ("00") generated by quantizing the voltage VA (0.7 V). Due to the quantized signal DOUT being set to "00", the reference voltage VB is set to "1 V".

Further, in the latter half (i.e., the period when the control signal is the high level), the memory DFF outputs the quantized signal DOUT ("00") to the memory DFF as the quantized signal DSIG, the quantized signal DOUT being received from the memory DFF.

For example, in period P4 of the cycle T(n), in response to the rising edge of the clock CLK1, the memory DFF outputs the quantized signal DSIG ("00") received from the data selector DSEL in period P3. Due to the quantized signal DOUT being set to "00", the reference voltage VB is set to "1 V".

As described above, in this embodiment as well, in the integrating period LH (periods P3 and P4), the quantized signal DOUT is maintained at the value ("00") which is the value of the quantized signal DSIG' in period P2, and the reference voltage VB is also maintained at the voltage (1 V) corresponding to the quantized signal DOUT.

Further, before the end of the period P4, the control signal CNT3 changes from the high level to the low level. Therefore, in the charging period FH of the cycle T(n+1), the memory DFF receives the output signal DSIG' from the operator OPP2 as the quantized signal DSIG.

For example, in period P2 of the cycle T(n+1), the data selector DSEL outputs the quantized signal DSIG' ("01") to the memory DFF as the quantized signal DSIG, the quantized signal DSIG' being received from the operator OPP2.

Further, in period P3 of the cycle T(n+1), in response to the rising edge of the clock CLK1, the memory DFF outputs the quantized signal DSIG ("01") received from the data selector DSEL in period P2.

Further, in period P4 of the cycle T(n+1), in response to the rising edge of the clock CLK1, the memory DFF outputs the quantized signal DSIG ("01") received from the data selector DSEL in the latter half of period P3.

Therefore, in this embodiment as well, in the integrating period LH (periods P3 and P4), the quantized signal DOUT is maintained at the value ("01") which is the value of the quantized signal DSIG' in period P2, and the reference voltage VB is also maintained at the voltage (2 V) corresponding to the quantized signal DOUT.

Figure 12:
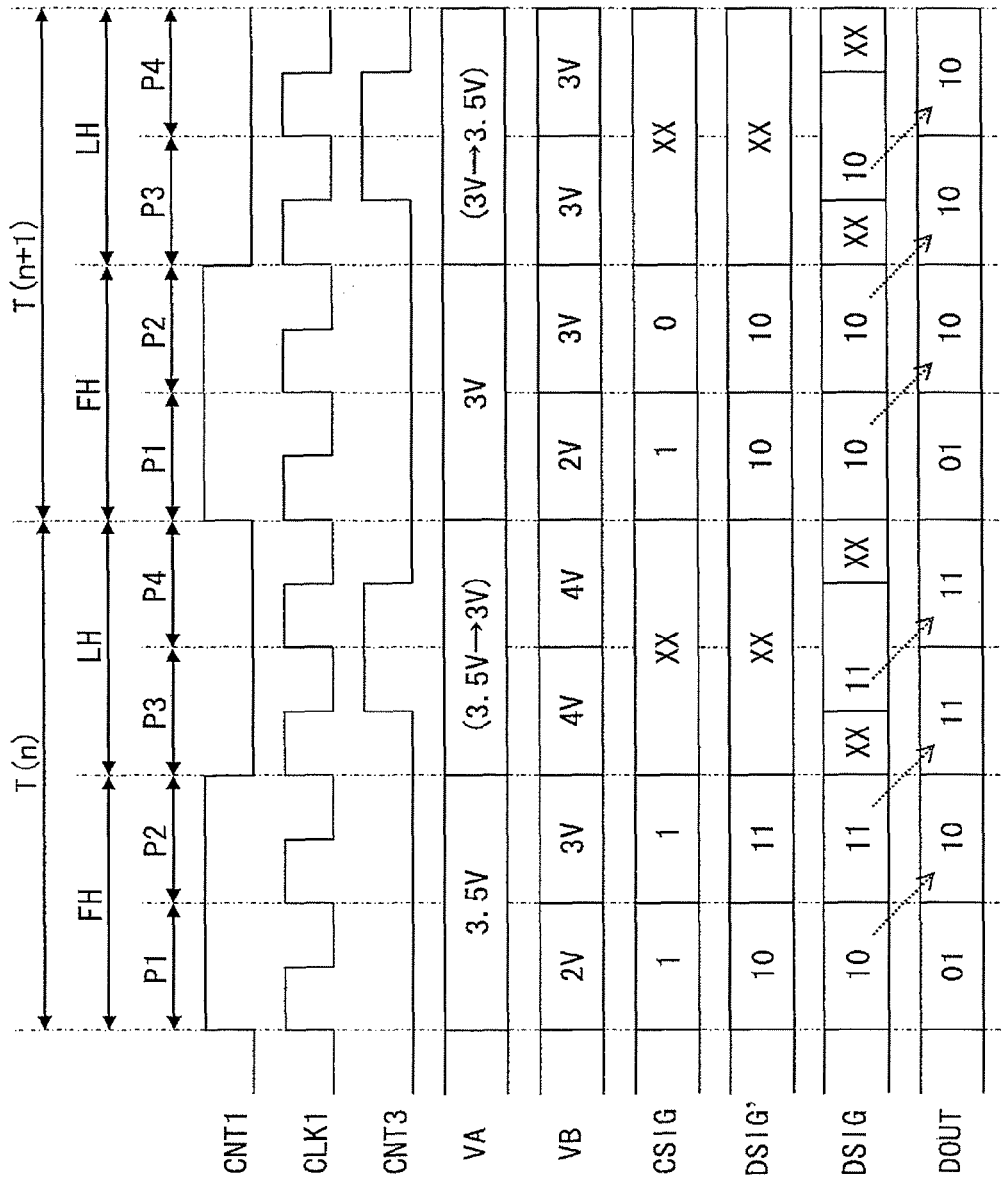
FIG. 12 illustrates another example operation timing of the quantizer of FIG. 10.

FIG. 12 is an example operation timing chart of the operation of the quantizer 20B of FIG. 10. More specifically, FIG. 12 illustrates the operation timing of the quantizer 20B when the input voltage VIN of the modulator is 3.5 V.

The conditions of the quantization are same as those indicated in the remarks of FIG. 2. Namely, FIG. 12 illustrates an example operation of the signals of FIG. 4. The meanings of the symbols such as "XX" in FIG. 12 are the same as those in FIG. 5.

Further, detailed description of the operation already described with reference to FIGS. 5, 6, and 11 may be herein omitted. For example, the control signal CNT3 is the same as the control signal CNT3 described with reference to FIG. 11.

The operation timing of the quantizer 20B in the charging period FH (periods P1 and P2) is the same as that of the quantizer 20 of FIG. 6 except for the control signal CNT3 and the quantized signal DSIG'.

The operation timing of the quantizer 20B in the integrating period LH (periods P3 and P4) is the same as that of the quantizer 20 of FIG. 6 except for control signal CNT3 and the quantized signals DSIG' and DSIG.

For example, in period P2 of the cycle T(n), the memory DFF receives the quantized signal DSIG ("11") generated by quantizing the voltage VA (3.5 V). Further, in period P3 of the cycle T(n), in response to the rising edge of the clock CLK1, the memory DFF outputs the quantized signal DSIG ("11") received from the data selector DSEL in period P2.

Namely, in period P3 of the cycle T(n), the memory DFF outputs the quantized signal DSIG ("11") generated by quantizing the voltage VA (3.5 V). Due to the quantized signal DSIG being set to "11", the reference voltage VB is set to 4 V.

Further, in the latter half of period P3 (i.e., the period when the control signal CNT3 is high level), the data selector DSEL outputs the quantized signal DOUT ("11") to the memory DFF as the quantized signal DSIG, the quantized signal DOUT ("11") being received from the memory DFF.

Therefore, in period P4 of the cycle T(n), in response to the rising edge of the clock CLK1, the memory DFF outputs the quantized signal DSIG ("11") received from the data selector DSEL in the latter half of period P3. By doing this, in the integrating period LH, the quantized signal DOUT is maintained at a value "11". Further, due to the quantized signal DOUT being set to "11", the reference voltage VB is also maintained at "4 V".

In period P2 of the cycle T(n+1), the memory DFF receives the quantized signal DSIG ("10") generated by quantizing the voltage VA (3 V). Then, in period P3 of the cycle T(n+1), in response to the rising edge of the clock CLK1, the memory DFF outputs the quantized signal DOUT ("10") generated by quantizing the voltage VA (3 V). Due to the quantized signal DOUT being set to "10", the reference voltage VB is set to "3 V".

Further, in the latter half of period P3 (i.e., in the period when the control signal CNT3 is the high level), the data selector DSEL outputs the quantized signal DOUT ("10") to the memory DFF as the quantized signal DSIG, the quantized signal DOUT ("10") being received from the memory DFF. Therefore, in period P4 of the cycle T(n+1), in response to the rising edge of the clock CLK1, the memory DFF outputs the quantized signal DSIG ("10") received from the data selector DSEL in the latter half of period P3. By doing this, in the integrating period LH, the quantized signal DOUT is maintained at a value "10". Further, due to the quantized signal DOUT being set to "10", the reference voltage VB is also maintained at "3 V".

As described above, in the integrating period LH (periods P3 and P4), the quantized signal DOUT is maintained at the value of the quantized signal DSIG' in period P2 and the reference voltage VB is also maintained at the voltage corresponding to the value of the quantized signal DOUT.

As described above, in this embodiment as well, the same effect as that in the embodiment described before this embodiment may also be obtained. Further, in this embodiment, the quantizer 20B includes the data selector DSEL outputting either the quantized signal DSIG' or the quantized signal DOUT to the memory DFF as the quantized signal DSIG.

For example, in the integrating period LH, the data selector DSEL outputs the quantized signal DOUT to the memory DFF as the quantized signal DSIG, the quantized signal DOUT being received from the memory DFF. Therefore, it is not desired for the operator OPP2 to maintain the value of the quantized signal DSIG' in the integrating period LH, the value of the quantized signal DSIG' being confirmed in the charging period FH. Therefore, the logic (pattern) of the operator OPP2 may be simplified.

FIGS. 13 and 14 illustrate another example operation of the quantizers 20, 20A, and 20B according to embodiments described above. With respect to FIGS. 13 and 14, the operation of the quantizer 20 is described.

The operation of FIGS. 13 and 14 may be achieved by hardware alone or may be achieved by using software to control hardware. In FIGS. 13 and 14, the signals CSIG, DSIG, and DOUT are expressed in a binary digit form. Further, the meaning of the values "0" and "1" are the same as those used in FIG. 4.

In the operation of FIGS. 13 and 14, for example, the modulator quantizes the input signal (voltage) VIN in a range from 0 V to 4 V (i.e., VIN≤4) into three-bit quantized signal DOUT. For example, three-bit values "000", "001", "010", "011", "100", "101", "110", and "111" of the quantized signal DOUT correspond to "0.5 V", "1 V", "1.5 V", "2 V", "2.5 V", "3 V", "3.5 V", and "4 V", of the reference voltage VB.

In the example of FIGS. 13 and 14, when the voltage VA is equal to or greater than 0 V and equal to or less than 0.5 V (i.e., 0≤VA≤0.5), the value of the quantized signal DOUT is set to "000". When the voltage VA is greater than 0.5 V and equal to or less than 1 V (i.e., 0.5<VA≤1), the value of the quantized signal DOUT is set to "001".

When the voltage VA is greater than 1 V and equal to or less than 1.5 V (i.e., 1<VA≤1.5), the value of the quantized signal DOUT is set to "010". When the voltage VA is greater than 1.5 V and equal to or less than 2 V (i.e., 1.5<VA≤2), the value of the quantized signal DOUT is set to "011".

When the voltage VA is greater than 2 V and equal to or less than 2.5 V (i.e., 2<VA≤2.5), the value of the quantized signal DOUT is set to "100". When the voltage VA is greater than 2.5 V and equal to or less than 3 V (i.e., 2.5<VA≤3), the value of the quantized signal DOUT is set to "101". When the voltage VA is greater than 3 V and equal to or less than 3.5 V (i.e., 3<VA≤3.5), the value of the quantized signal DOUT is set to "110".

When the voltage VA is greater than 3.5 V and equal to or less than 4 V (i.e., 3.5<VA≤4), the value of the quantized signal DOUT is set to "111".

The operation of FIGS. 13 and 14 is performed in every cycle T of the control signal CNT1. The number of the clock CLK1 in the charging period FH is, for example, three, and is the same as the number of bits of the quantized signal DOUT. For example, the frequency of the clock CLK1 is six times the frequency of the control signal CNT1.

In this case, for example, steps S400 through S404, and S438 are executed in the first cycle of the clock CLK1 in every cycle T of the control signal CNT1. Further, for example, steps S406 through S410, S424, S440 through S444, and S458 are executed in the second cycle of the clock CLK1 in every cycle T of the control signal CNT1.

Further, steps S412 through S416, S420, S426 through S430, S434, S446 through S450, S454, S460 through S464, and S468 are executed in the third cycle of the clock CLK1 in every cycle T of the control signal CNT1. Namely, steps S400 through S416, S420, S424 through S430, S434, S438 through S450, S454, S458 through S464, and S468 are executed in the charging period FH (for example, the charging period FH where the control signal CNT1 is the high level).

Further, steps S418, S422, S432, S436, S452, S456, S466, and S470 are executed in the fourth cycle of the clock CLK1 in every cycle T of the control signal CNT1. Namely, steps S418, S422, S432, S436, S452, S456, S466, and S470 are executed in the beginning of the integrating period LH.

Further, FIG. 13 corresponds to the operation of the quantizer 20 when the input voltage VIN is equal to or greater than 0 V and equal to or less than 2 V.

In step S400, the quantized signal DOUT is set to "011", and the reference voltage VB is set to "2 V". The reference voltage VB first to be received by the comparator CMP is set to an intermediate value of the range of plural reference voltages VB (0.5 V, 1 V, 1.5 V, 2 V, 2.5 V, 3 V, 3.5 V and 4 V).

In step S402, the comparator CMP determines whether the output voltage VA output from the integrator 10 is equal to or less than 2 V (i.e., the voltage corresponding to the reference voltage VB selected by the level selector RSEL).

When determining that the voltage VA is equal to or less than 2 V (YES in step S102), the process goes to step S404. On the other hand, when determining that the voltage VA is greater than 2 V (NO in step S402), the process goes to step S438 of FIG. 14.

In step S404, the comparison signal CSIG is set to "0" and the quantized signal DSIG is set to "001". For example, the comparator CMP sets the comparison signal CSIG to "0" because the voltage VA is equal to or less than the reference voltage VB. Then, the operator OPP sets the quantized signal DSIG to "001" because the comparison signal CSIG is set to "0".

Due to the comparison signal CSIG indicating the comparison result in step S402 being set to "0", the voltage VA is limited to a range from 0 V to 2 V (0≤VA≤2).

Namely, the quantized signal DSIG is set to "001" which is an intermediate value (near the center) of the quantized values ("000", "001", "010", and "011") corresponding to a range of the voltage VA (0≤VA≤2) limited by the determination in step S402. For example, when there are two intermediate values (quantized values) near the center, a lower value is used.

In step S406, due to the quantized signal DSIG being set to "001", the quantized signal DOUT is set to "001" and the reference voltage VB is set to "1 V".

In step S408, the comparator CMP determines whether the output voltage VA output from the integrator 10 is equal to or less than 1 V (i.e., the reference voltage VB selected by the level selector RSEL).

When determining that the voltage VA is equal to or less than 1 V (YES in step S408), the process goes to step S410. On the other hand, when determining that the voltage VA is greater than 1 V (NO in step S408), the process goes to step S424.

In step S410, the comparison signal CSIG is set to "0" and the quantized signal DSIG is set to "000". Further, due to the comparison signal CSIG indicating the comparison result in step S408 being set to "0", the voltage VA is limited to a range from 0 V to 1 V (0≤VA≤1).

Namely, the quantized signal DSIG is set to "000" which is an intermediate value (near the center) of the quantized values ("000" and "001") corresponding to a range of the voltage VA (0≤VA≤1) limited by the determination in step S408. For example, when there are two intermediate values (quantized values) near the center, a lower value is used.

In step S412, due to the quantized signal DSIG output from the operator OPP being set to "000", the quantized signal DOUT is set to "000" and the reference voltage VB is set to "0.5 V".

In step S414, the comparator CMP determines whether the output voltage VA output from the integrator 10 is equal to or less than 0.5 V (i.e., the reference voltage VB selected by the level selector RSEL). When determining that the voltage VA is equal to or less than 0.5 V (YES in step S414), the process goes to step S416.

On the other hand, when determining that the voltage VA is greater than 0.5 V (NO in step S414), the process goes to step S420.

In step S416, the comparison signal CSIG is set to "0" and the quantized signal DSIG is maintained at "000". Further, due to the comparison signal CSIG indicating the comparison result in step S408 being set to "0", the voltage VA is limited to a range from 0 V to 0.5 V (0≤VA≤0.5).

For example, the quantized value corresponding to the range of the voltage VA (0≤VA≤0.5) limited by the determination in step S414 is limited to one ("000"). Therefore, the quantized signal DSIG is confirmed to be "000".

In step S418, due to the quantized signal DSIG output from the operator OPP being set to "000", the quantized signal DOUT is set to "000" and the reference voltage VB is set to "0.5 V". Accordingly, when, for example, the voltage VA is equal to or less than 0.5 V, the quantizer 20 outputs the quantized signal DOUT ("000") and the reference voltage VB (0.5 V).

In step S420, the comparison signal CSIG is set to "1" and the quantized signal DSIG is set to "001". For example, due to the comparison signal CSIG being set to "1", the operator OPP adds "1" to the value ("000") of the quantized signal DSIG set in step S410, and set the value of the quantized signal DSIG to "001".

Further, due to the comparison signal CSIG indicating the comparison result in step S414 being set to "1", the voltage VA is limited to a range from 0.5 V to 1 V (0.5<VA≤1). For example, the quantized value corresponding to the range of the voltage VA (0.5<VA≤1) limited by the determination in step S414 is limited to one ("001"). Therefore, the quantized signal DSIG is confirmed to be "001".

In step S422, due to the quantized signal DSIG output from the operator OPP being set to "001", the quantized signal DOUT is set to "001" and the reference voltage VB is set to "1 V". Accordingly, when, for example, the voltage VA is greater than 0.5 V and equal to or less than 1 V, the quantizer 20 outputs the quantized signal DOUT ("001") and the reference voltage VB (1 V).

In step S424, the comparison signal CSIG is set to "1" and the quantized signal DSIG is set to "010". Further, due to the comparison signal CSIG indicating the comparison result in step S408 being set to "1", the voltage VA is limited to a range from 1 V to 2 V (1<VA≤2).

Namely, the quantized signal DSIG is set to "010" which is an intermediate value (near the center) of the quantized values ("010" and "011") corresponding to a range of the voltage VA (1<VA≤2) limited by the determination in step S408. For example, when there are two intermediate values (quantized values) near the center, a lower value is used.

In step S426, due to the quantized signal DSIG output from the operator OPP being set to "010", the quantized signal DOUT is set to "010" and the reference voltage VB is set to "1.5 V".

In step S428, the comparator CMP determines whether the output voltage VA output from the integrator 10 is equal to or less than 1.5 V (i.e., the reference voltage VB selected by the level selector RSEL).

When determining that the voltage VA is equal to or less than 1.5 V (YES in step S428), the process goes to step S430. On the other hand, when determining that the voltage VA is greater than 1.5 V (NO in step S428), the process goes to step S434.

In step S430, the comparison signal CSIG is set to "0" and the quantized signal DSIG is maintained at "010". Further, due to the comparison signal CSIG indicating the comparison result in step S428 being set to "0", the voltage VA is limited to a range from 1 V to 1.5 V (1<VA≤1.5).

For example, the number of the quantized value corresponding to range (1<VA≤1.5) of the voltage VA limited in step S428 is one, so that the quantized value is limited to "010". Therefore, the value of the quantized signal DSIG is confirmed to be "010".

In step S432, due to the quantized signal DSIG output from the operator OPP being set to "010", the quantized signal DOUT is set to "010" and the reference voltage VB is set to "1.5 V". Accordingly, when, for example, the voltage VA is greater than 1 V and equal to or less than 1.5 V, the quantizer 20 outputs the quantized signal DOUT ("010") and the reference voltage VB (1.5 V).

In step S434, the comparison signal CSIG is set to "1" and the quantized signal DSIG is set to "010". For example, due to the comparison signal CSIG being set to "1", the operator OPP adds "1" to the value ("010") of the quantized signal DSIG set in step S424, and set the value of the quantized signal DSIG to "010".

Due to the comparison signal CSIG indicating the comparison result in step S428 being set to "1", the voltage VA is limited to a range from 1.5 V to 2 V (1.5<VA≤2).

For example, the number of the quantized value corresponding to range (1.5<VA≤2) of the voltage VA limited in step S428 is one, so that the quantized value is limited to "011". Therefore, the value of the quantized signal DSIG is confirmed to be "011".

In step S436, due to the quantized signal DSIG output from the operator OPP being set to "011", the quantized signal DOUT is set to "011" and the reference voltage VB is set to "2 V".

Accordingly, when, for example, the voltage VA is greater than 1.5 V and equal to or less than 2 V, the quantizer 20 outputs the quantized signal DOUT ("011") and the reference voltage VB (2 V).

The quantized signal DOUT and the reference voltage VB set in steps S418, S422, S432, and S436 are maintained until the end of the integrating period LH.

Further, FIG. 14 corresponds to the operation of the quantizer 20 when the input voltage VIN is greater than 2 V and equal to or less than 4 V.

In step S438, the comparison signal CSIG is set to "1" and the quantized signal DSIG is set to "101". Further, due to the comparison signal CSIG indicating the comparison result in step S402 of FIG. 13 being set to "1", the voltage VA is limited to a range from 2 V to 4 V (2<VA≤4).

Namely, the quantized signal DSIG is set to "101" which is an intermediate value (near the center) of the quantized values ("100", "101", "110", and "111") corresponding to a range of the voltage VA (2<VA≤4) limited by the determination in step S402. For example, when there are two intermediate values (quantized values) near the center, a lower value is used.

In step S440, due to the quantized signal DSIG output from the operator OPP being set to "101", the quantized signal DOUT is set to "101" and the reference voltage VB is set to "3 V".

In step S442, the comparator CMP determines whether the output voltage VA output from the integrator 10 is equal to or less than 3 V (i.e., the reference voltage VB selected by the level selector RSEL).

When determining that the voltage VA is equal to or less than 3 V (YES in step S442), the process goes to step S444.

On the other hand, when determining that the voltage VA is greater than 3 V (NO in step S442), the process goes to step S458.

In step S444, the comparison signal CSIG is set to "0" and the quantized signal DSIG is set to "100". Further, due to the comparison signal CSIG indicating the comparison result in step S442 being set to "0", the voltage VA is limited to a range from 2 V to 3 V (2<VA≤3).

Namely, the quantized signal DSIG is set to "100" which is an intermediate value (near the center) of the quantized values ("100" and "101") corresponding to a range of the voltage VA (2<VA≤3) limited by the determination in step S442. For example, when there are two intermediate values (quantized values) near the center and corresponding to the range of the voltage VA limited in step S442, a lower value is used.

In step S446, due to the quantized signal DSIG output from the operator OPP being set to "100", the quantized signal DOUT is set to "100" and the reference voltage VB is set to "2.5 V".

In step S448, the comparator CMP determines whether the output voltage VA output from the integrator 10 is equal to or less than 2.5 V (i.e., the reference voltage VB selected by the level selector RSEL).

When determining that the voltage VA is equal to or less than 2.5 V (YES in step S448), the process goes to step S450. On the other hand, when determining that the voltage VA is greater than 2.5 V (NO in step S448), the process goes to step S454.

In step S450, the comparison signal CSIG is set to "0" and the quantized signal DSIG is maintained at "100". Further, due to the comparison signal CSIG indicating the comparison result in step S448 being set to "0", the voltage VA is limited to a range from 2 V to 2.5 V (2<VA≤2.5).

For example, the number of the quantized value corresponding to range (2<VA≤2.5) of the voltage VA limited in step S428 is one, so that the quantized value is limited to "100". Therefore, the value of the quantized signal DSIG is confirmed to be "100".

In step S452, due to the quantized signal DSIG output from the operator OPP being set to "100", the quantized signal DOUT is set to "100" and the reference voltage VB is set to "2.5 V". Accordingly, when, for example, the voltage VA is greater than 2 V and equal to or less than 2.5 V, the quantizer 20 outputs the quantized signal DOUT ("100") and the reference voltage VB (2.5 V).

In step S454, the comparison signal CSIG is set to "1" and the quantized signal DSIG is set to "101". For example, due to the comparison signal CSIG being set to "1", the operator OPP adds "1" to the value ("100") of the quantized signal DSIG set in step S444, and set the value of the quantized signal DSIG to "101".

Due to the comparison signal CSIG indicating the comparison result in step S448 being set to "1", the voltage VA is limited to a range from 2.5 V to 3 V (2.5<VA≤3). For example, the number of the quantized value corresponding to range (2.5<VA≤3) of the voltage VA limited in step S448 is one, so that the quantized value is limited to "101". Therefore, the value of the quantized signal DSIG is confirmed to be "101".

In step S456, due to the quantized signal DSIG output from the operator OPP being set to "101", the quantized signal DOUT is set to "101" and the reference voltage VB is set to "3 V".

Accordingly, when, for example, the voltage VA is greater than 2.5 V and equal to or less than 3 V, the quantizer 20 outputs the quantized signal DOUT ("101") and the reference voltage VB (3 V).

In step S458, the comparison signal CSIG is set to "1" and the quantized signal DSIG is set to "110". Further, due to the comparison signal CSIG indicating the comparison result in step S442 being set to "1", the voltage VA is limited to a range from 3 V to 4 V (3<VA≤4).

Namely, the quantized signal DSIG is set to "110" which is an intermediate value (near the center) of the quantized values ("110" and "111") corresponding to a range of the voltage VA (3<VA≤4) limited by the determination in step S442.

For example, when there are two intermediate values (quantized values) near the center and corresponding to the range of the voltage VA limited in step S442, a lower value is used.

In step S460, due to the quantized signal DSIG output from the operator OPP being set to "110", the quantized signal DOUT is set to "110" and the reference voltage VB is set to "3.5 V".

In step S462, the comparator CMP determines whether the output voltage VA output from the integrator 10 is equal to or less than 3.5 V (i.e., the reference voltage VB selected by the level selector RSEL). When determining that the voltage VA is equal to or less than 3.5 V (YES in step S462), the process goes to step S464.

On the other hand, when determining that the voltage VA is greater than 3.5 V (NO in step S462), the process goes to step S468.

In step S464, the comparison signal CSIG is set to "0" and the quantized signal DSIG is maintained at "110". Further, due to the comparison signal CSIG indicating the comparison result in step S462 being set to "0", the voltage VA is limited to a range from 3 V to 3.5 V (3<VA≤3.5).

For example, the number of the quantized value corresponding to range (3<VA≤3.5) of the voltage VA limited in step S462 is one, so that the quantized value is limited to "110". Therefore, the value of the quantized signal DSIG is confirmed to be "110".

In step S466, due to the quantized signal DSIG output from the operator OPP being set to "110", the quantized signal DOUT is set to "110" and the reference voltage VB is set to "3.5 V". Accordingly, when, for example, the voltage VA is greater than 3 V and equal to or less than 3.5 V, the quantizer 20 outputs the quantized signal DOUT ("110") and the reference voltage VB (3.5 V).

In step S468, the comparison signal CSIG is set to "1" and the quantized signal DSIG is set to "111". For example, due to the comparison signal CSIG being set to "1", the operator OPP adds "1" to the value ("110") of the quantized signal DSIG set in step S458, and set the value of the quantized signal DSIG to "111".

Due to the comparison signal CSIG indicating the comparison result in step S462 being set to "1", the voltage VA is limited to a range from 3.5 V to 4 V (3.5<VA≤4).

For example, the number of the quantized value corresponding to range (3.5<VA≤4) of the voltage VA limited in step S462 is one, so that the quantized value is limited to "111". Therefore, the value of the quantized signal DSIG is confirmed to be "111".

In step S470, due to the quantized signal DSIG output from the operator OPP being set to "111", the quantized signal DOUT is set to "111" and the reference voltage VB is set to "4 V".

Accordingly, when, for example, the voltage VA is greater than 3.5 V and equal to or less than 4 V, the quantizer 20 outputs the quantized signal DOUT ("111") and the reference voltage VB (4 V).

The quantized signal DOUT and the reference voltage VB set in steps S452, S456, S466, and S470 are maintained until the end of the integrating period LH.

As described above, the quantizer 20 repeats to compare between the output voltage VA output from the integrator 10 and the reference voltage VB selected by the level selector RSEL and updates the reference voltage VB (in steps S412, S426 and the like), and generates the quantized signal DSIG in the charging period FH.

Here, the SNR of the modulator may be improved by approximately 6 dB by, for example, increasing the number of the quantization bit (i.e., the number of bits of the quantized signal DOUT) by one. Further, the SNR of the modulator may also be improved by approximately 3 dB by, doubling the oversampling ratio (i.e., the ratio of sampling frequency to the signal frequency).

Therefore, in the example of FIGS. 13 and 14, the SNR may be improved by approximately 12 dB when compared with a modulator when the input signal is quantized into one bit. This improvement may have an effect equivalent to that obtained in a case where a 16 times higher sampling frequency is used.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of superiority or inferiority of the invention. Although the embodiment of the present inventions has been described in detail, it is to be understood that various changes, substitutions, and alterations could be made hereto without departing from the sprit and scope of the invention.

What is claimed is:

1. A modulator that quantizes a first signal into a quantized signal having a plurality of bits, the modulator comprising:
    an integrator configured to perform sampling on the first signal in a first period, and to integrate a difference between the first signal and a reference signal in a second period; and
    a quantizer configured to receive a second signal which is an output of the integrator and to operate in synchronization with a first clock having a cycle shorter than the first period, the quantizer configured to generate the quantized signal on the basis of the second signal in the first period and to output the reference signal on the basis of the quantized signal to the integrator.

2. The modulator as claimed in claim 1,
    wherein the quantizer includes
        a level selector configured to select one reference signal from among a plurality of reference signals and to output the selected reference signal,
        a comparator configured to receive the second signal and the reference signal from the integrator and the level selector, respectively, the comparator configured to compare the second signal with the reference signal in the first period and to output a comparison signal indicating a comparison result,
        an operator configured to receive the comparison signal from the comparator and to generate the quantized signal based on the comparison signal received in the first period, and
        a delayer configured to operate in synchronization with the first clock, the delayer configured to delay the quantized signal received from the operator and to output the delayed quantized signal to the level selector, and
    wherein the number of clocks of the first clock in the first period is the same as the number of bits of the quantized signal.

3. The modulator as claimed in claim 2,
    wherein the delayer includes
        a clock generating circuit configured to generate a second clock using the first clock, a delay circuit configured to operate in synchronization with the second clock, the delay circuit configured to delay the quantized signal received from the operator and to output the delayed quantized signal to the level selector, and wherein the number of clocks of the second clock in the first period is the same as the number of bits of the quantized signal, and the number of the clocks of the second clock in the second period is one.

4. The modulator as claimed in claim 2, wherein the integrator includes a signal generator configured to generate a data selection signal, and a data selector configured to output the quantized signal received from the delayer to the delayer when the data selection signal is asserted and to output the quantized signal received from the operator to the delayer when the data selection signal is negated, and wherein the signal generator is configured to assert the data selection signal after a timing when the quantized signal is first acquired by the delayer in the second period and before a timing when the quantized signal is secondly acquired by the delayer in the second period and to negate the data selection signal after a timing when the quantized signal is last acquired by the delayer in the second period and before an end of the second period.

5. The modulator as claimed in claim 2, wherein the number of clocks of the first clock in the second period is one.

\* \* \* \* \*